US011856736B1

(12) United States Patent
Lazarowich

(10) Patent No.: US 11,856,736 B1
(45) Date of Patent: Dec. 26, 2023

(54) COMPUTING DEVICE SYSTEM AND METHOD WITH RACKS CONNECTED TOGETHER TO FORM A SLED

(71) Applicant: Core Scientific, Inc., Bellevue, WA (US)

(72) Inventor: Kamil Lazarowich, San Jose, CA (US)

(73) Assignee: Core Scientific Operating Company, Bellevue, WA (US)

( * ) Notice: Subject to any disclaimer, the term of this patent is extended or adjusted under 35 U.S.C. 154(b) by 286 days.

(21) Appl. No.: 17/102,604

(22) Filed: Nov. 24, 2020

Related U.S. Application Data

(60) Provisional application No. 62/983,890, filed on Mar. 2, 2020.

(51) Int. Cl.
*H05K 7/20* (2006.01)
*H05K 7/14* (2006.01)

(52) U.S. Cl.
CPC ....... *H05K 7/20836* (2013.01); *H05K 7/1488* (2013.01)

(58) Field of Classification Search
CPC ................................ H05K 7/20836
See application file for complete search history.

(56) References Cited

U.S. PATENT DOCUMENTS

| | | | |
|---|---|---|---|
| 9,763,354 B1 | 9/2017 | Michaud et al. | |
| 9,983,639 B2 | 5/2018 | Chen | |
| 10,327,351 B2 | 6/2019 | McGraw et al. | |
| 10,602,636 B2 | 3/2020 | McGraw et al. | |
| 11,382,232 B1* | 7/2022 | Madhavkant | H05K 7/1487 |
| 2012/0201002 A1* | 8/2012 | Schmitt | G06F 1/1601 361/730 |
| 2014/0265793 A1* | 9/2014 | Evans | H05K 7/1489 312/334.44 |
| 2016/0040904 A1* | 2/2016 | Zhou | G05B 13/042 700/276 |
| 2016/0102951 A1* | 4/2016 | Cole | H05K 7/1495 361/679.02 |
| 2017/0257970 A1* | 9/2017 | Alleman | G06F 1/20 |
| 2017/0325354 A1* | 11/2017 | Lee | H05K 7/20209 |
| 2018/0151975 A1* | 5/2018 | Aoki | H05K 7/1452 |
| 2020/0396128 A1* | 12/2020 | Tseng | G06F 11/0751 |

* cited by examiner

*Primary Examiner* — Nathan L Laughlin
(74) *Attorney, Agent, or Firm* — Fishman Stewart PLLC

(57) ABSTRACT

A computing device system may include a plurality of computing devices and a plurality of racks connected together to form a sled. The plurality of racks may each be connected with a respective set of computing devices of the plurality of computing devices. Each rack of the plurality of racks may include a thermal barrier configured to limit fluid and/or heat transfer. A method of operating computing devices in a facility may include connecting a respective set of computing devices to each of a plurality of racks, connecting the plurality of racks to form a sled, and/or connecting the sled to an opening of a thermal wall separating a first chamber from a second chamber.

19 Claims, 20 Drawing Sheets

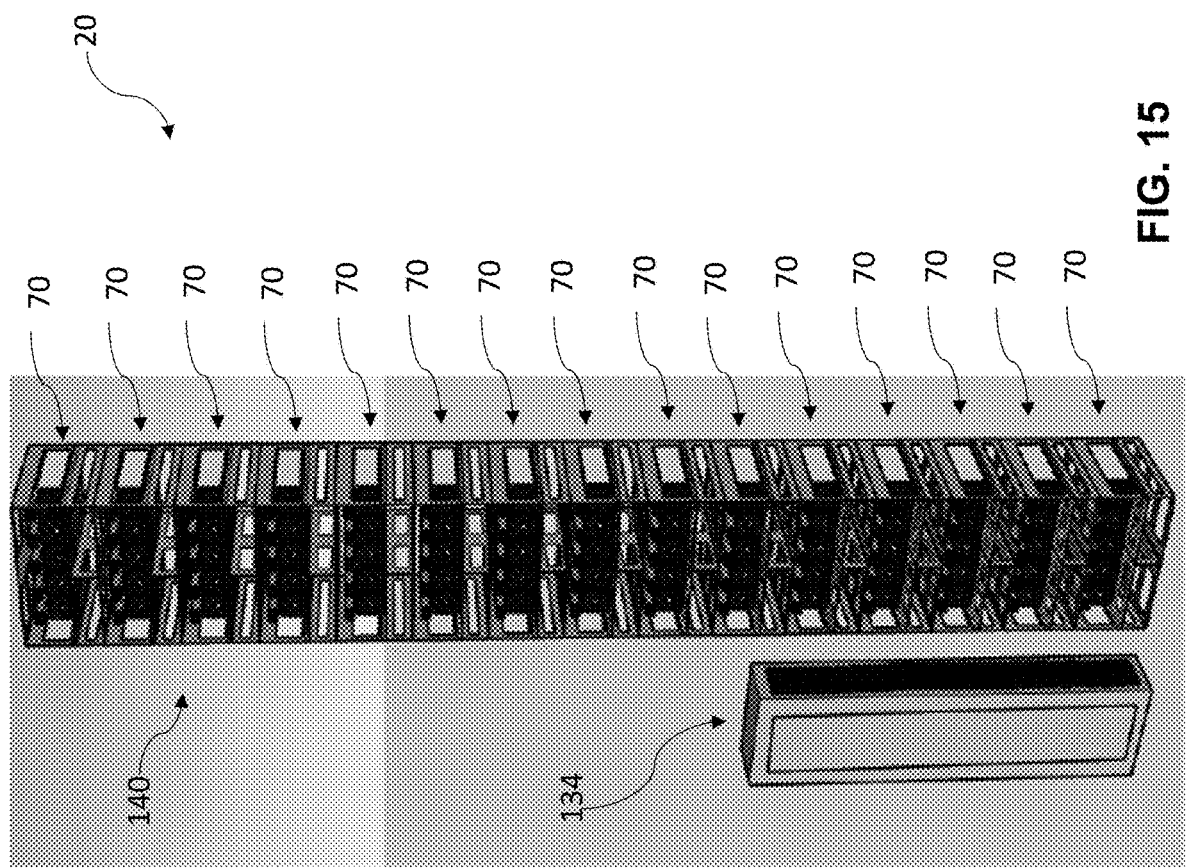

COMPUTING DEVICE SYSTEM AND METHOD WITH RACKS CONNECTED TOGETHER TO FORM A SLED

CROSS-REFERENCE TO RELATED APPLICATIONS

This application claims the benefit of U.S. Provisional Patent Application Ser. No. 62/983,890, filed on Mar. 2, 2020, and titled "COMPUTING DEVICE SYSTEM AND METHOD", the contents of which are hereby incorporated by reference in their entirety.

TECHNICAL FIELD

The present disclosure generally relates to computing systems, including computing systems that may be used in connection with mounting and/or operating computing devices in a facility.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some computing systems and facilities involve complex and/or custom assembly and building processes that are inefficient. In some circumstances, a plurality of computing devices may be disposed in a facility (e.g., a datacenter). Mounting a plurality of computing devices within the facility may involve a considerable amount of time, labor, and/or expense.

There is a desire for solutions/options that minimize or eliminate one or more challenges or shortcomings of computing systems and methods. The foregoing discussion is intended only to illustrate examples of the present field and is not a disavowal of scope.

SUMMARY

In examples, a computing device system may include a plurality of computing devices and a plurality of racks connected together to form a sled. The plurality of racks may each be connected with a respective set of computing devices of the plurality of computing devices. Each rack of the plurality of racks may include a thermal barrier configured to limit fluid and/or heat transfer.

With examples, a method of operating computing devices in a facility may include connecting a respective set of computing devices to each of a plurality of racks, connecting the plurality of racks to form a sled, and/or connecting the sled to an opening of a thermal wall separating a first chamber from a second chamber.

In examples, a rack for housing a plurality of computing devices may include a first side panel and a second side panel, each with one or more brackets to restrict side-to-side movement of the rack when stacked, a top panel connected to the first side panel and the second side panel, a bottom panel connected to the first side panel and the second side panel. The top panel, the bottom panel, the first side panel, and/or the second side panel may form a back opening configured to securely hold an insulative panel with exhaust openings configured for alignment and/or connection with an opening in a thermal wall. The rack may include a shelf panel connected to the first and second side panels and configured to support said plurality of computing devices. The rack may include a support panel connected to the shelf panel and the bottom panel to form two openings configured to receive forklift forks. The first side panel and the second side panel may be configured to support a total weight at least ten times greater than a weight of said plurality of computing devices, the first side panel, the second side panel, the top panel, and the bottom panel.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects is best gained through a discussion of various examples thereof. Although the drawings represent illustrations, the drawings are not necessarily to scale, and certain features may be exaggerated to better illustrate and explain an innovative aspect of an example. Further, the exemplary illustrations described herein are not intended to be exhaustive or otherwise limiting or restricted to the precise form and configuration shown in the drawings and disclosed in the following detailed description. Exemplary illustrations are described in detail by referring to the drawings as follows:

FIG. 15 is a rear perspective view generally illustrating an example of a computing system according to teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
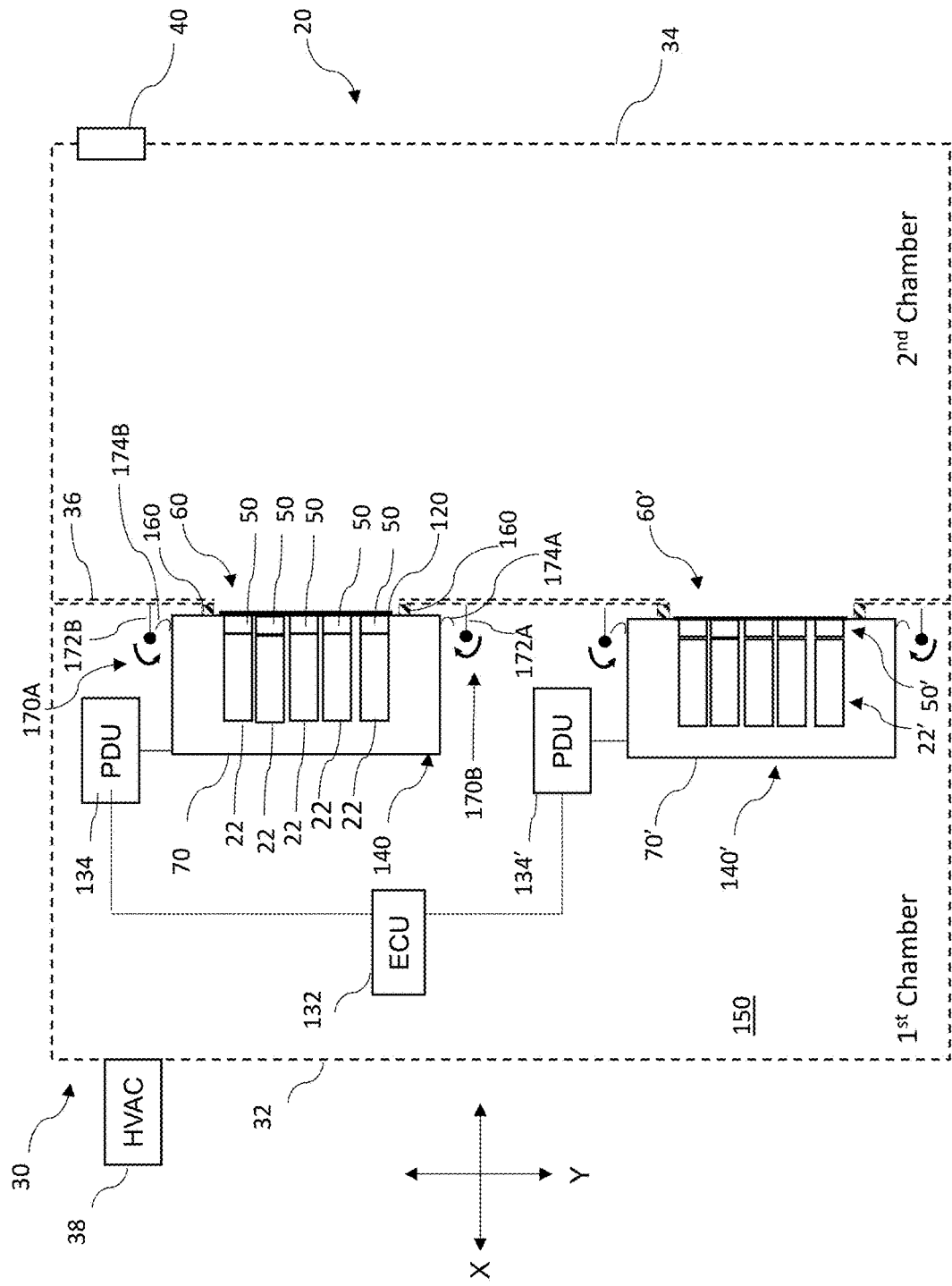
FIG. 1 is a top cross-sectional view generally illustrating an example of a computing system according to teachings of the present disclosure.
Figure 2:
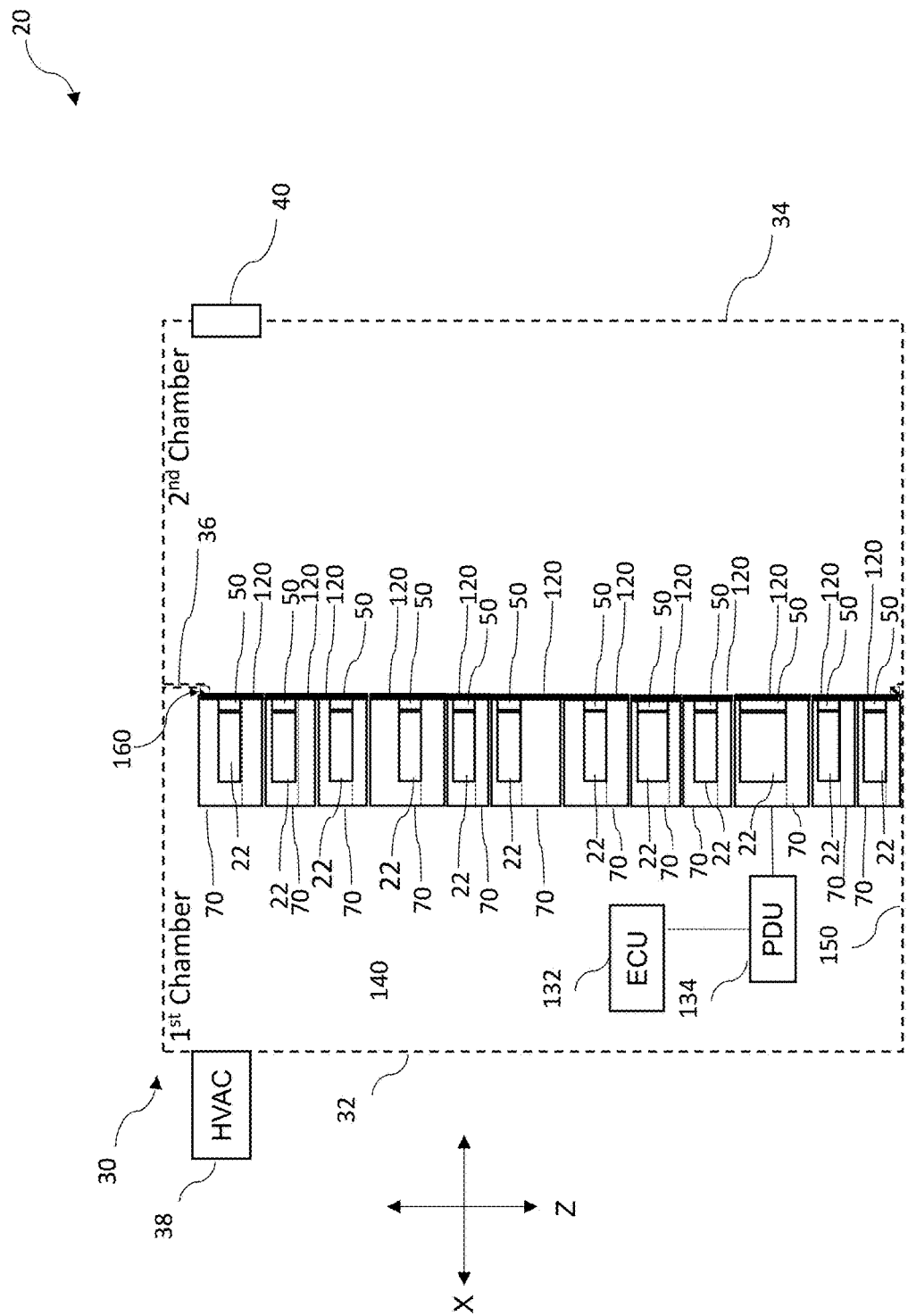
FIG. 2 is a side cross-sectional view generally illustrating an example of a computing system according to teachings of the present disclosure.
Figure 3:
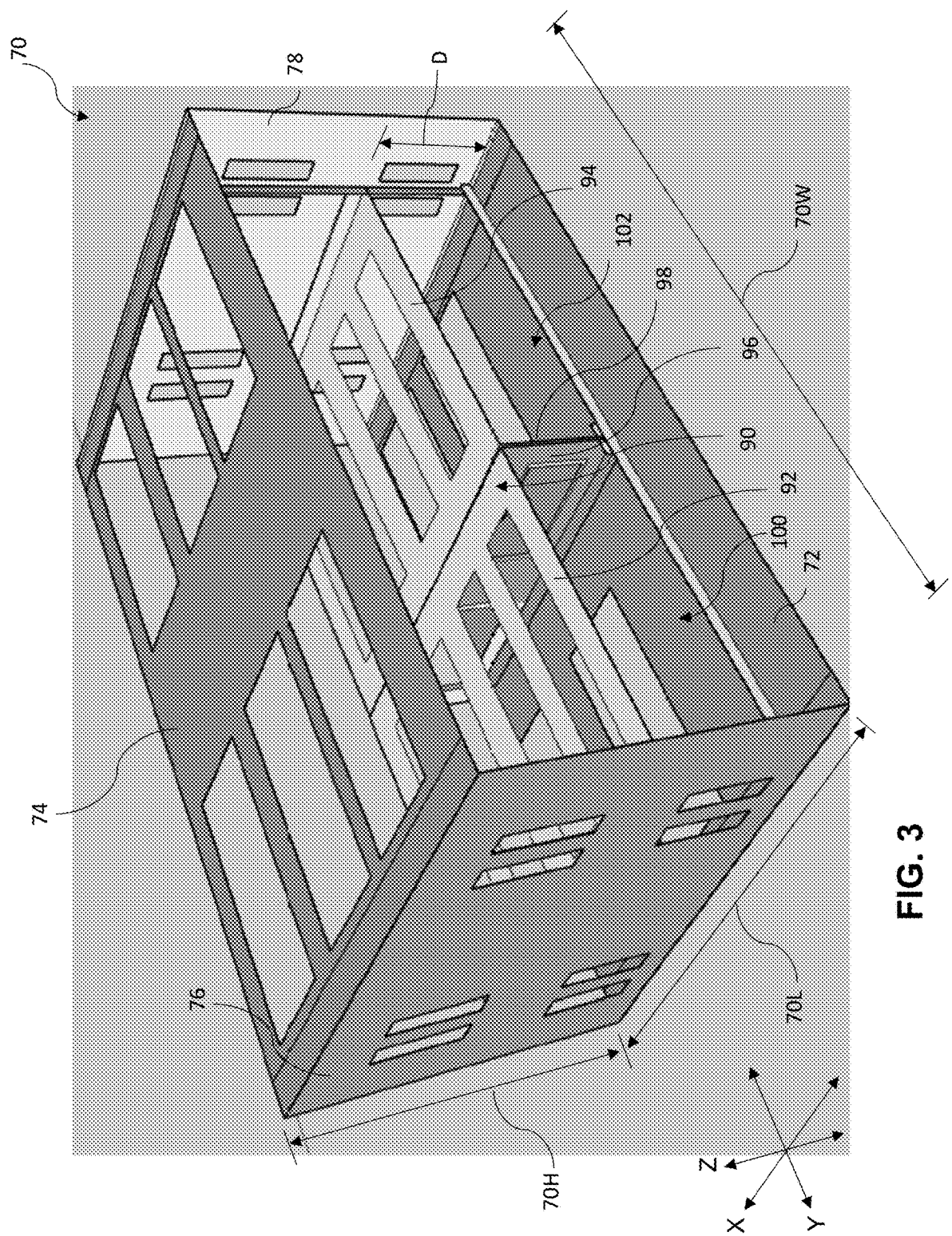
FIGS. 3 and 4 are perspective views generally illustrating examples of racks according to teachings of the present disclosure.
Figure 4:
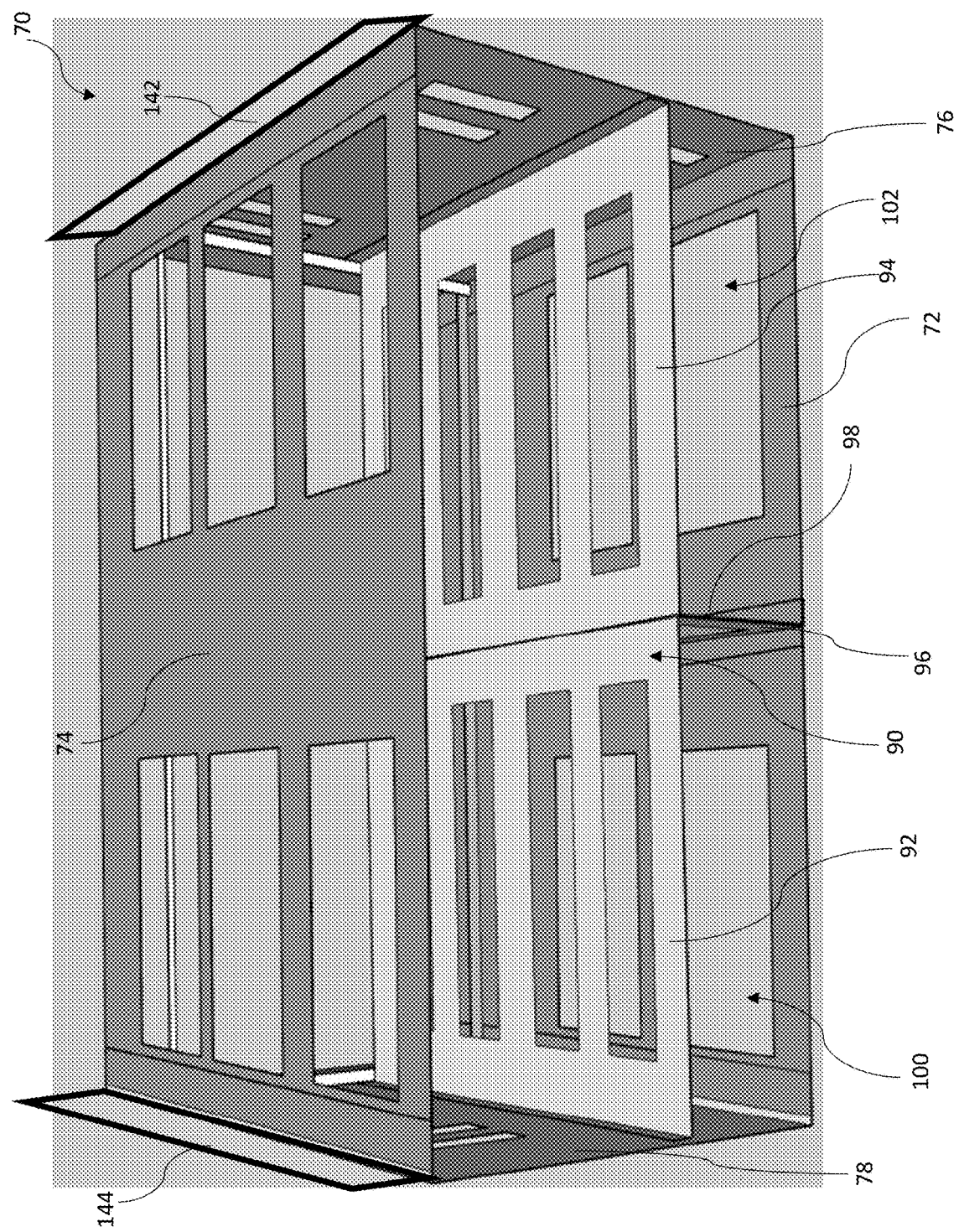
Figure 5:
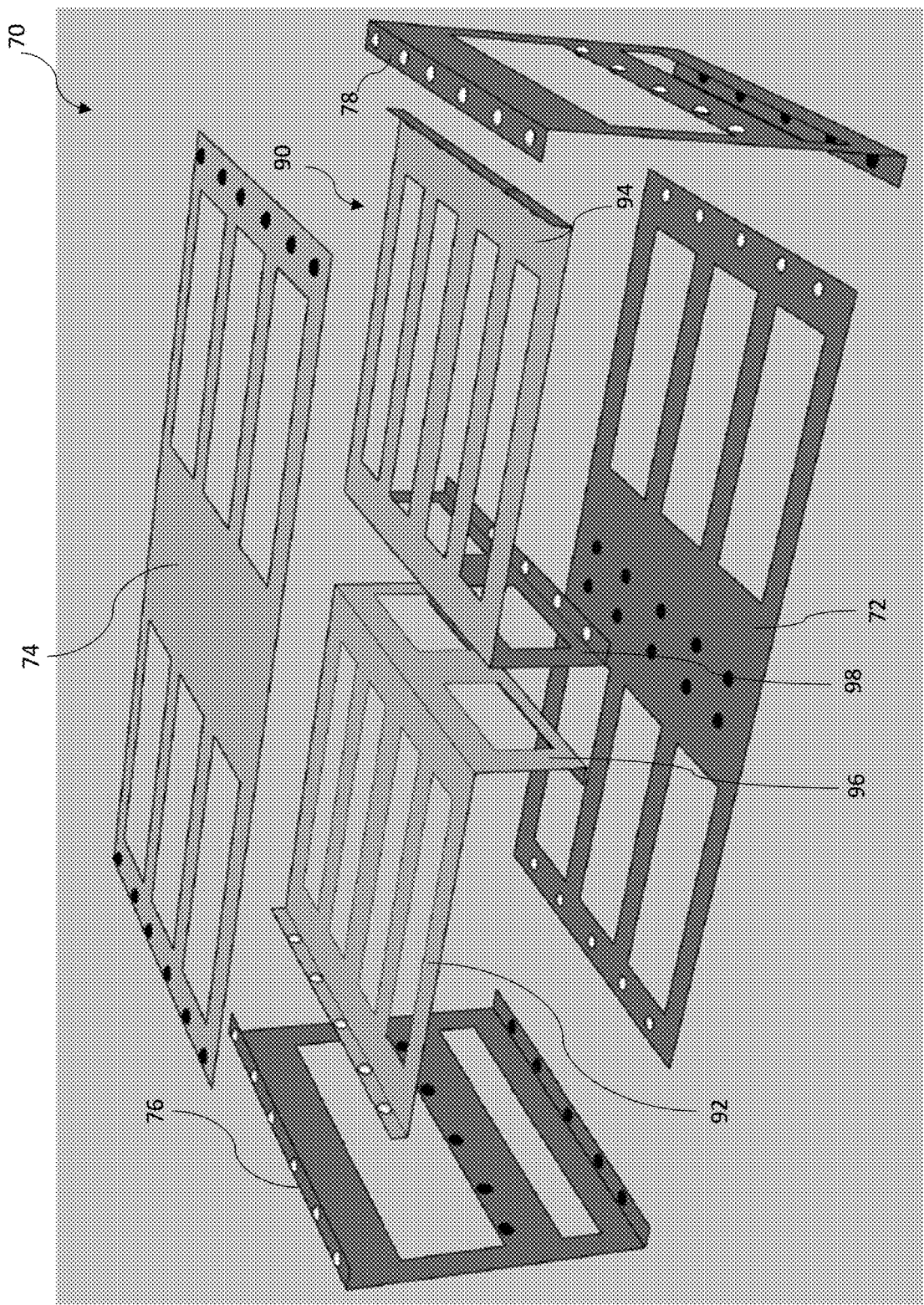
FIGS. 5 and 6 are exploded perspective views generally illustrating examples of racks according to teachings of the present disclosure.
Figure 6:
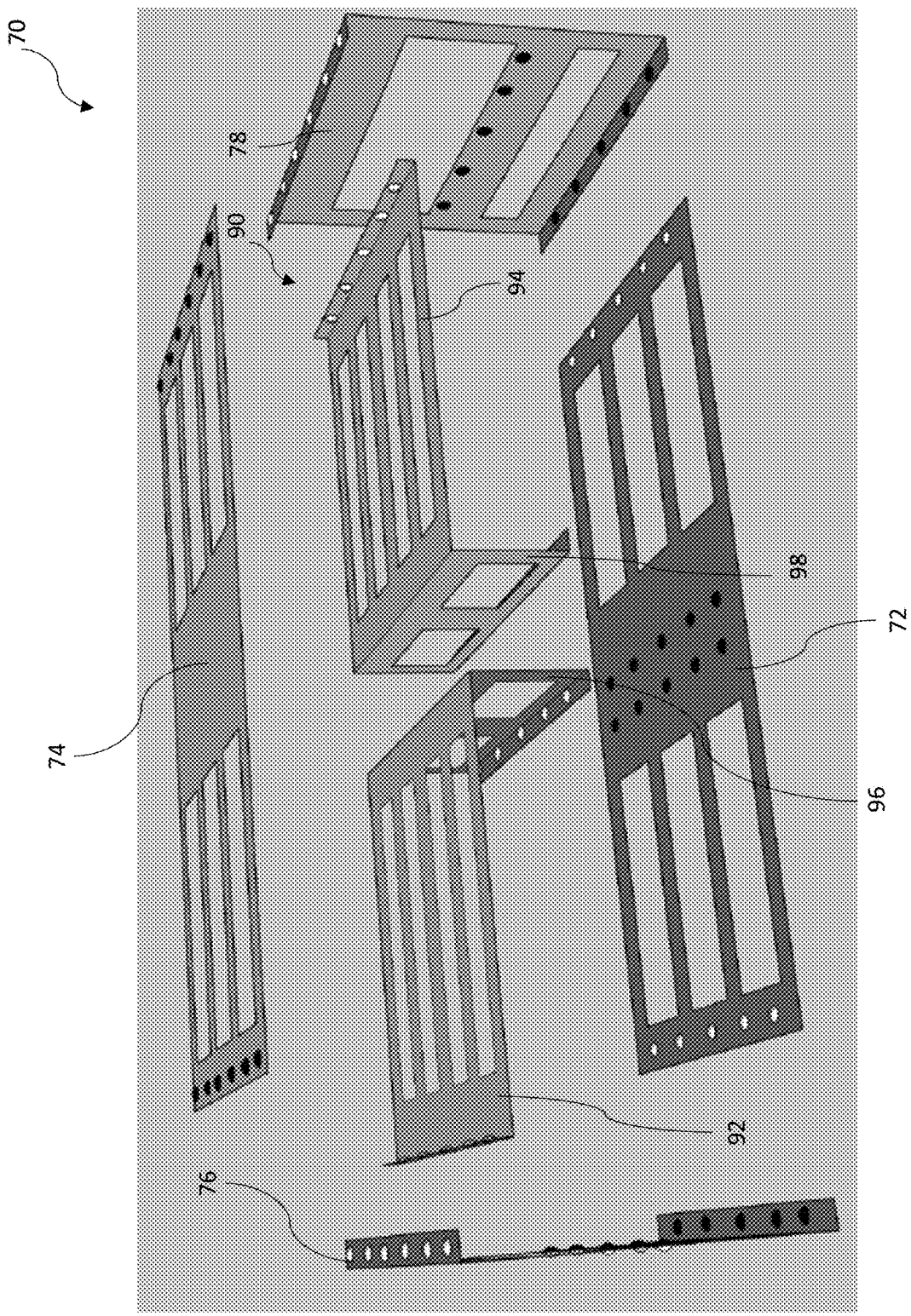

In examples, such as generally illustrated in FIGS. 1 and 2, a system 20 (e.g., a computing device system) may be configured for mounting and/or operating a plurality of computing devices 22, such as in a facility 30, in an efficient manner. A facility 30 may, for example and without limitation, be configured as a datacenter. A facility 30 may include one or more areas or chambers, such as a first chamber 32 and/or a second chamber 34. A thermal wall 36 may connect and/or be disposed at least partially between the first chamber 32 and the second chamber 34. The thermal wall 36 may provide thermal insulation between the first and second chambers 32, 34, and/or may restrict and/or prevent fluid communication between the first and second chambers 32, 34. The first chamber 32 may be configured as a cool chamber (or aisle) and/or the second chamber 34 may be configured as a hot chamber (or aisle). The air temperature of the first chamber 32 may be maintained, such as via a heating ventilation and air conditioning (HVAC) system 38, at a lower level than the second chamber 34. The second chamber 34 may include an outlet or exhaust port 40 via which fluid and/or heat may be exhausted.

With examples, a plurality of computing devices 22 may be disposed in the facility 30, such as in the first chamber 32. The plurality of computing devices 22 may be operated, such as at or near a maximum performance level (which may correspond to higher heat generation), to conduct one or more computing tasks. Computing tasks may, for example and without limitation, include cryptocurrency mining and/or artificial intelligence computations, among others. Operating computing devices 22 may involve generating heat, such as from processing units of the computing devices 22. A computing device 22 may include one or more cooling members 50, such as an air mover (e.g., a fan) that may be configured to cool and/or dissipate heat from the computing device 22. In examples, the computing devices 22 may be disposed in the first chamber 32 such that the computing devices 22 may operate in a relatively cool environment and the cooling members 50 may be configured to move air around, in, and/or near the computing devices 22 that may be heated by the computing device 22 (e.g., in the first chamber 32) into the second chamber 34. It may be desirable to limit the flow of fluid (e.g., hot air) and/or the transfer of heat from the second chamber 34 to the first chamber 32, such as to facilitate maintaining cooler temperatures in the first chamber 32. The thermal wall 36 may limit and/or prevent fluid flow from the second chamber 34 to the first chamber 32 (and/or vice versa).

With examples, the thermal wall 36 may include an opening 60 that may be configured for connection with the computing devices 22 and/or the cooling members 50 (e.g., fans) associated therewith, such as to facilitate movement of hot air from the computing devices 22 (e.g., in the first chamber 32) to the second chamber 34. A plurality of computing devices 22 may be connected to a common (e.g., the same) opening 60, such as in a modular configuration (e.g., instead of individually connecting each computing device to a respective opening in a thermal wall). With such configurations, for example, the complexity of building a thermal wall 36 may be reduced and/or the process of connecting computing devices 22 to the opening 60 may be simplified.

In examples, a system 20 may include one or more racks 70 that may be configured for connection with respective sets of computing devices 22. A set of computing devices 22 may include one or more computing devices 22.

With examples, a rack 70 may include one or more of a variety of shapes, sizes, configurations, and/or materials. As generally illustrated in FIGS. 3-6, examples of racks 70 may include a first portion 72, a second portion 74, a third portion 76, and/or a fourth portion 78. The first, second, third, and fourth portions 72-78 may be connected together, such as in a rectangular configuration. For example and without limitation, the third and fourth portions 76, 78 may be connected to opposite ends of the first and second portions 72, 74 such that the first and second portions 72, 74 are disposed substantially parallel to each other (e.g., function as top and bottom portions/panels), the third and fourth portions 76, 78 are disposed substantially parallel to each other and substantially perpendicular to the first and second portions 72, 74 (e.g., function as side portions/panels). A rack 70 may, for example and without limitation, include a height 70H of about 10 inches to about 17 inches, a width 70W of about 25 inches to about 35 inches, and/or a length 70L of about 12 inches to about 15 inches, but may include other dimensions. A rack 70 may be longer, wider, and/or taller than some or all computing devices 22 connected to the rack 70.

In examples, a rack 70 may include a shelf 90 (e.g., a shelf panel). The shelf 90 may be disposed substantially parallel to the first portion 72 and/or the second portion 74, and/or may be disposed between (e.g., in the Z-direction) the first portion 72 and the second portion 74. The shelf 90 may be connected to the first portion 72, the third portion 76, and/or the fourth portion 78. For example and without limitation, the shelf 90 may include a first section 92 that may be connected to the first portion 72 and the third portion 76, and/or may include a second section 94 that may be connected to the first portion 72 and the fourth portion 78. The first section 92 may include a first leg 96 that may extend substantially perpendicular from the first section 92, such as toward the first portion 72, and/or may be connected to the first portion 72. The second section 94 may include a second leg 98 that may extend substantially perpendicular from the second section 94, such as toward the first portion 72, and/or may be connected to the first portion 72. The first leg 96 and the second leg 98 may be substantially parallel to each other, the third portion 76, and/or the fourth portion 78. In examples, the first leg 96 and the second leg 98 may be formed separately or may be formed together as a single leg. Alternatively, a rack 70 may include only a first leg 96 or only a second leg 98. The first leg 96 and/or the second leg 98 may be configured as a support panel that may be connected to the shelf 90 and the first portion 72.

With examples, a height of a leg 96, 98 may correspond to a distance D between the first portion 72 and the shelf 90.

Figure 16:
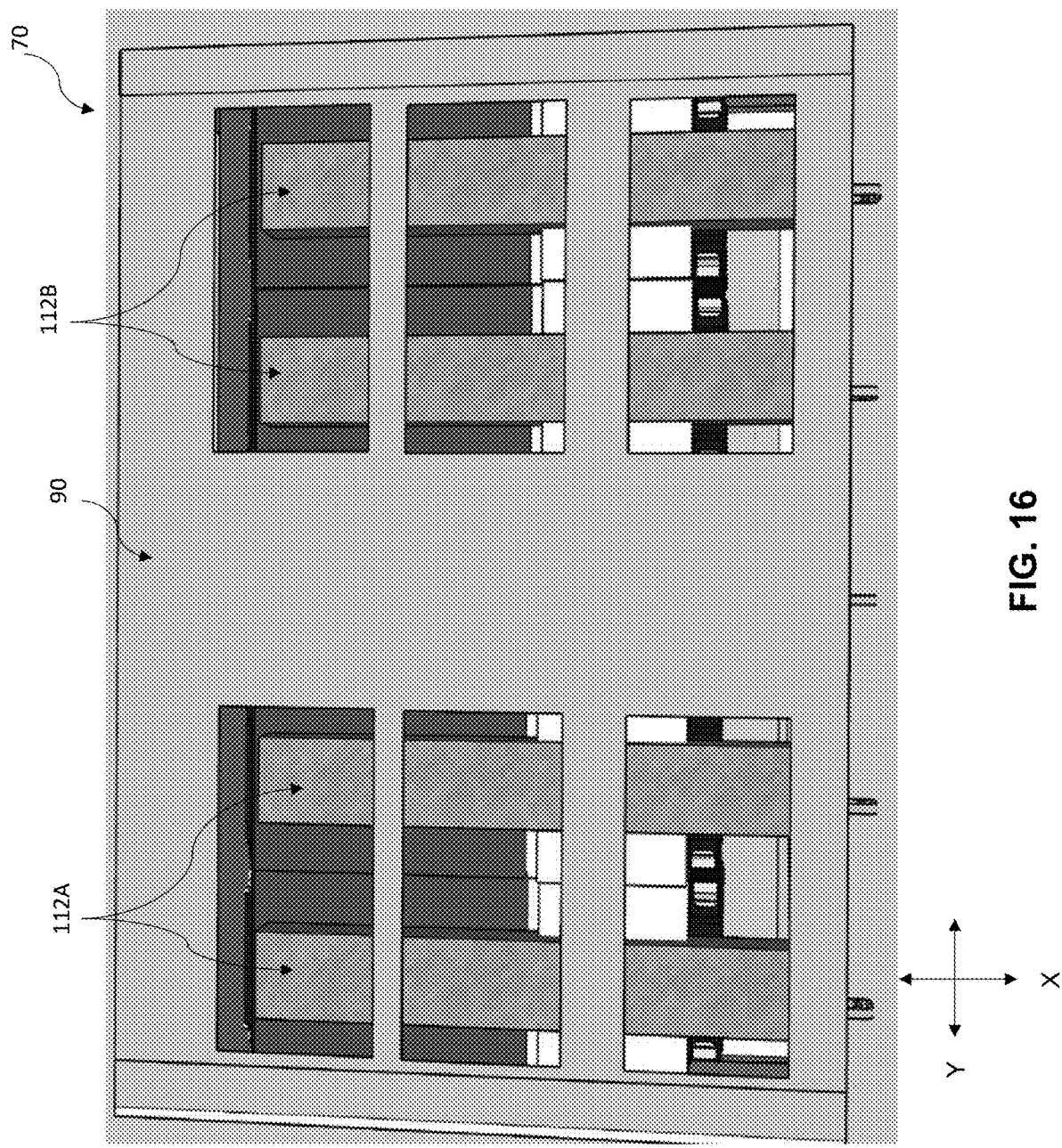
FIG. 16 is a cross-sectional view generally illustrating an example of a rack and forks of a forklift according to teachings of the present disclosure.
Figure 17:
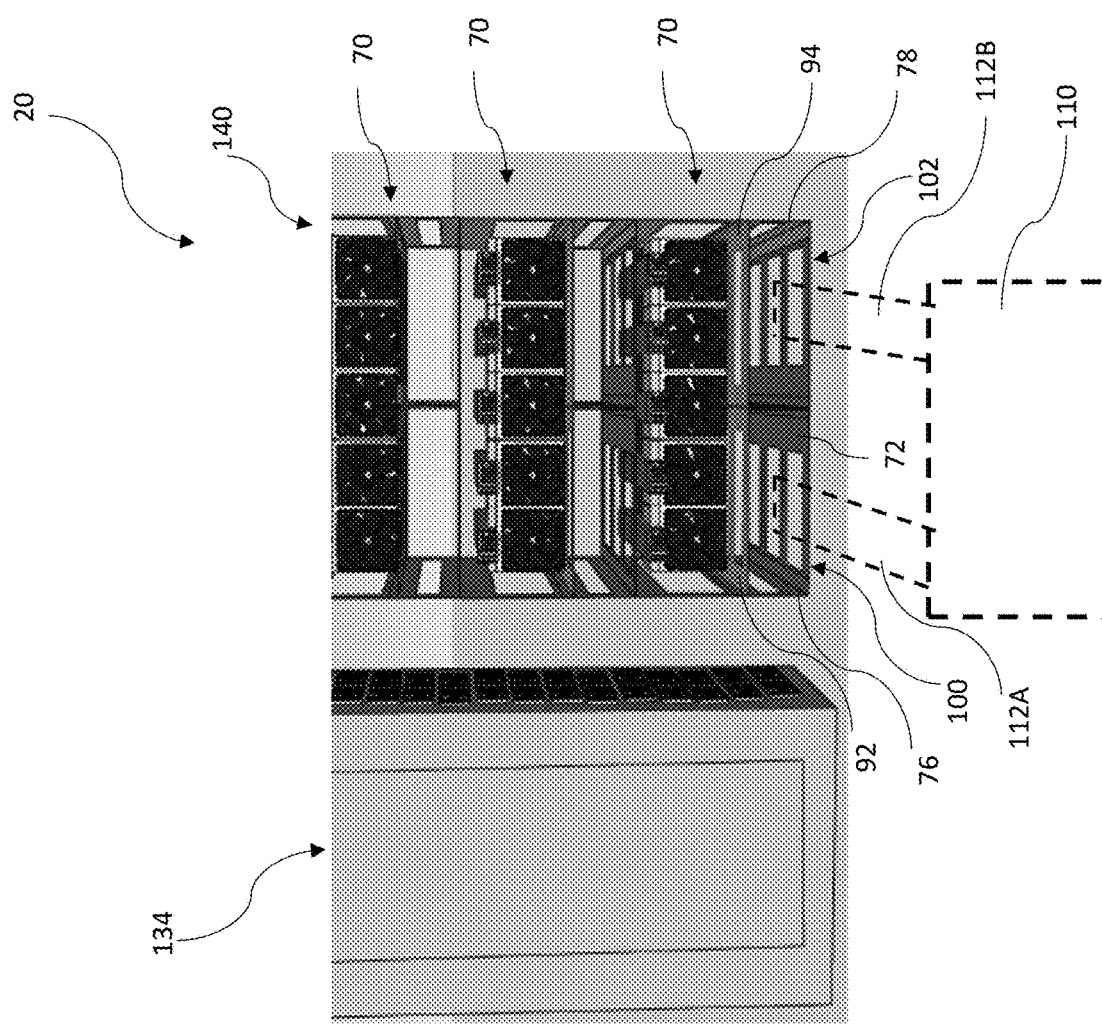
FIG. 17 is a rear perspective view generally illustrating an example of a computing system and forks of a forklift according to teachings of the present disclosure.

The distance D may, for example and without limitation, correspond to one or more dimensions of forks 112A, 112B of a forklift 110 (e.g., a motorized forklift, a pallet jack, a pallet stacker, etc.) such that a first fork 112A may extend into a first space/opening 100 that may be defined, at least in part, by the first section 92 of the shelf 90, the first portion 72, and/or the third portion 76 (see, e.g., FIGS. 16 and 17). Additionally or alternatively, a second fork 112B of the forklift 110 may extend into a second space/opening 102 that may be defined, at least in part, by the second section 94 of the shelf 90, the first portion 72, and/or the fourth portion 78. Forks 112A, 112B of a forklift 110 may, for example and without limitation, be about 1.5 inches thick/tall and about four inches wide. The first space 100 and the second space 102 may, for example and without limitation, each be at least 1.5 inches tall (e.g., about four to five inches tall) and at least four inches wide (e.g., about 12-18 inches wide). One or more portions of a rack 70, such as the first portion 72, the second portion 74, the third portion 76, the fourth portion 78, and/or the shelf 90, may, for example and without limitation, include metal (e.g., steel, aluminum, etc.).

Figure 7:
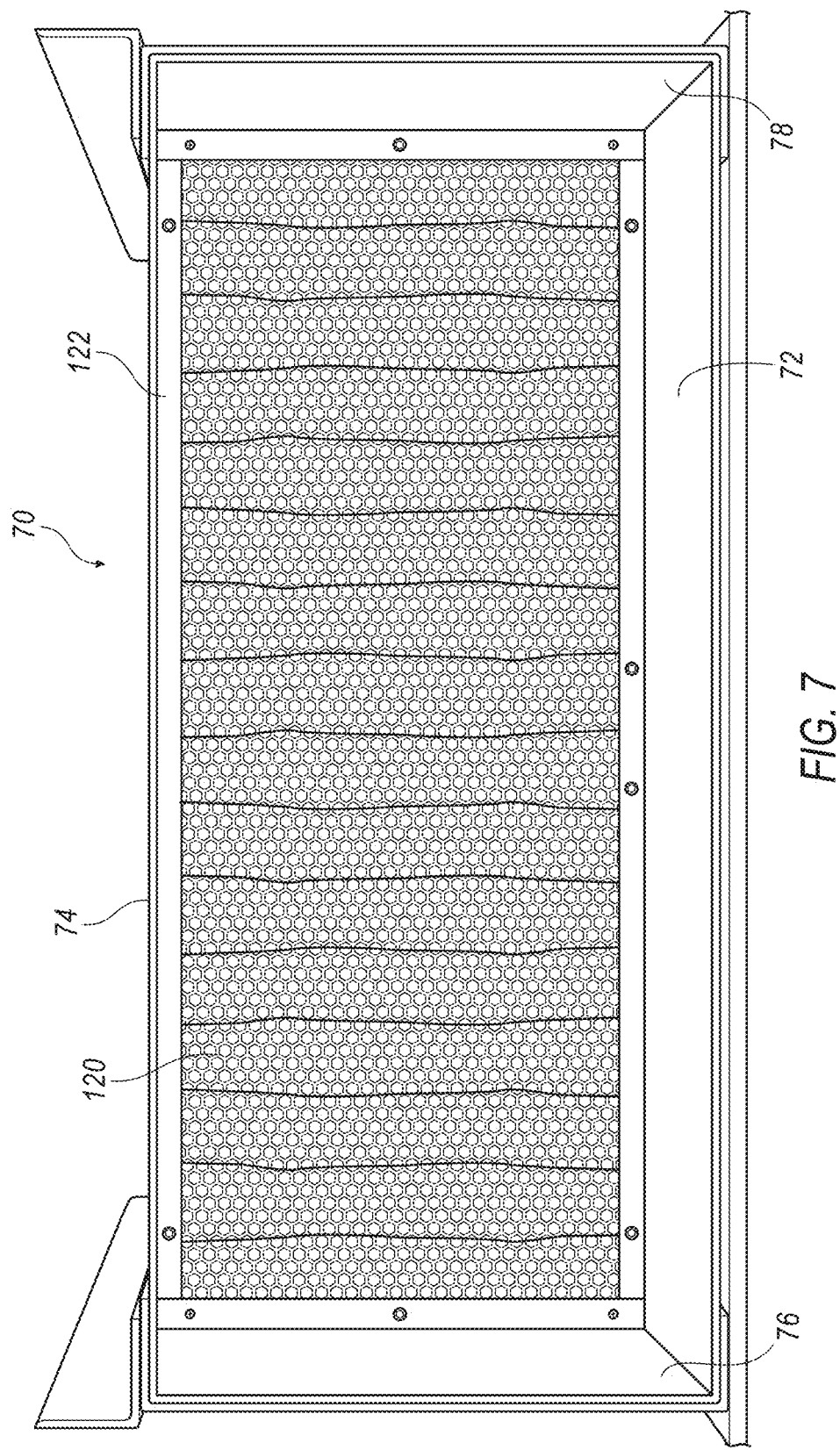
FIGS. 7 and 8 are perspective views generally illustrating examples of racks with thermal barriers according to teachings of the present disclosure.
Figure 8:
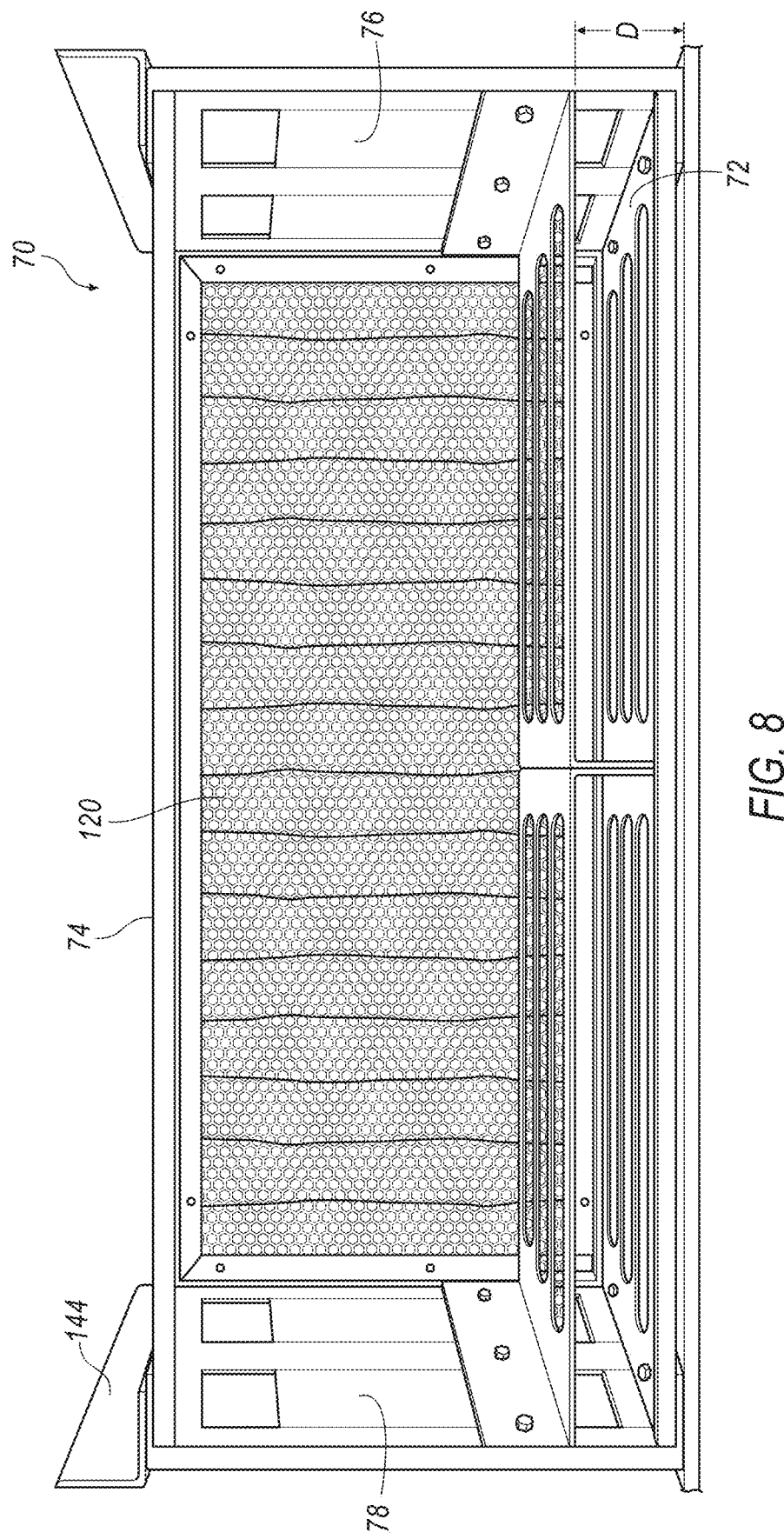

In examples, such as generally illustrated in FIGS. 7 and 8, a rack 70 may include a thermal barrier 120. The thermal barrier 120 may be connected to an open end 122 (e.g., a rear end) of the rack 70, such as via connections with rear ends of the first portion 72, the second portion 74, the third portion 76, and/or the fourth portion 78. The thermal barrier 120 may, for example and without limitation, include thermally insulating material (e.g., plastic, foam, fiberglass, etc.) that may be disposed between layers of foil and/or may be fluid impermeable. The thermal barrier 120 may cover substantially all of the open end 122 of the rack 70 (e.g., above and below a shelf 90), such as to limit fluid and/or heat transfer.

Figure 9:
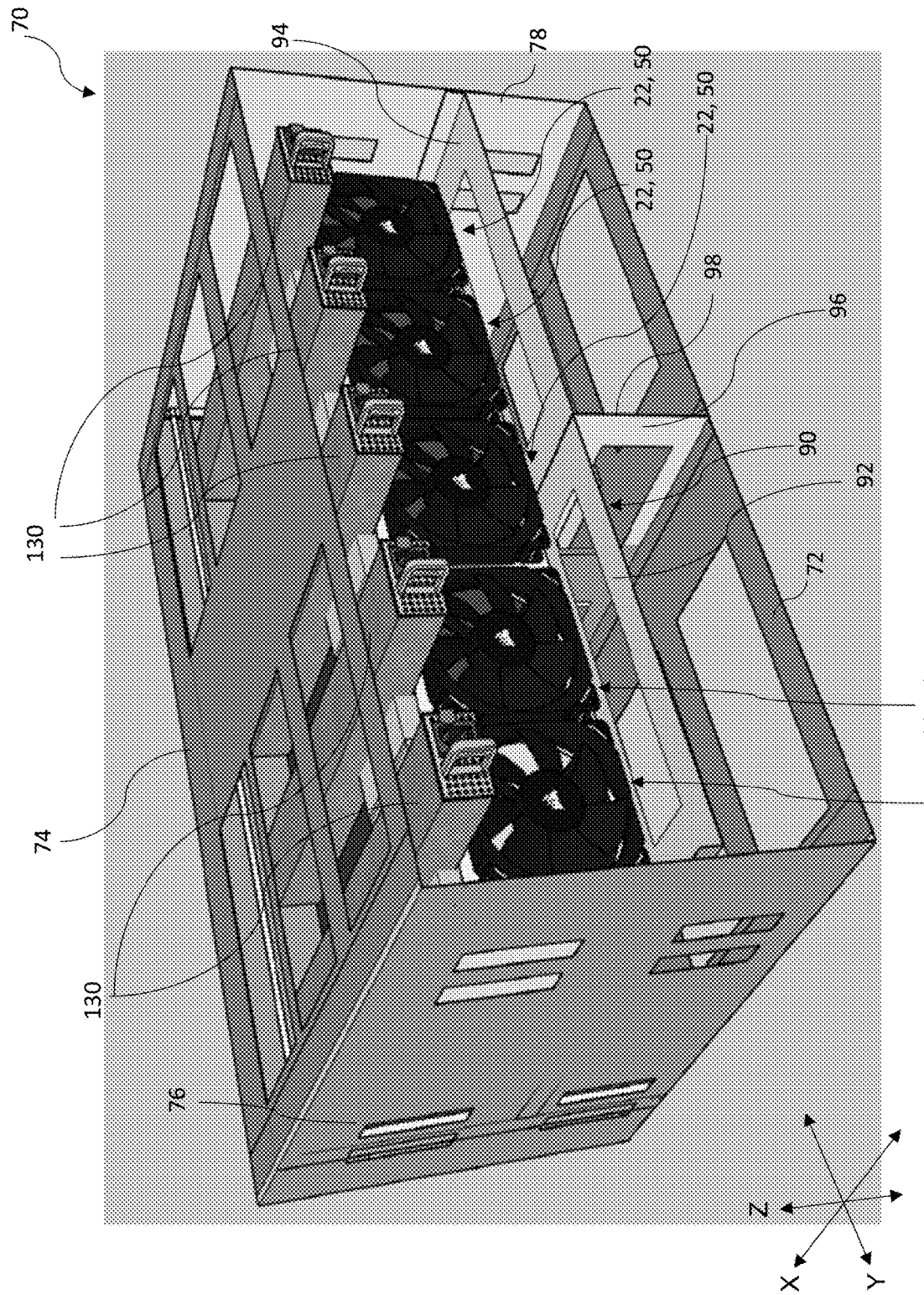
FIGS. 9 and 10 are perspective views generally illustrating examples of racks with computing devices according to teachings of the present disclosure.
Figure 10:
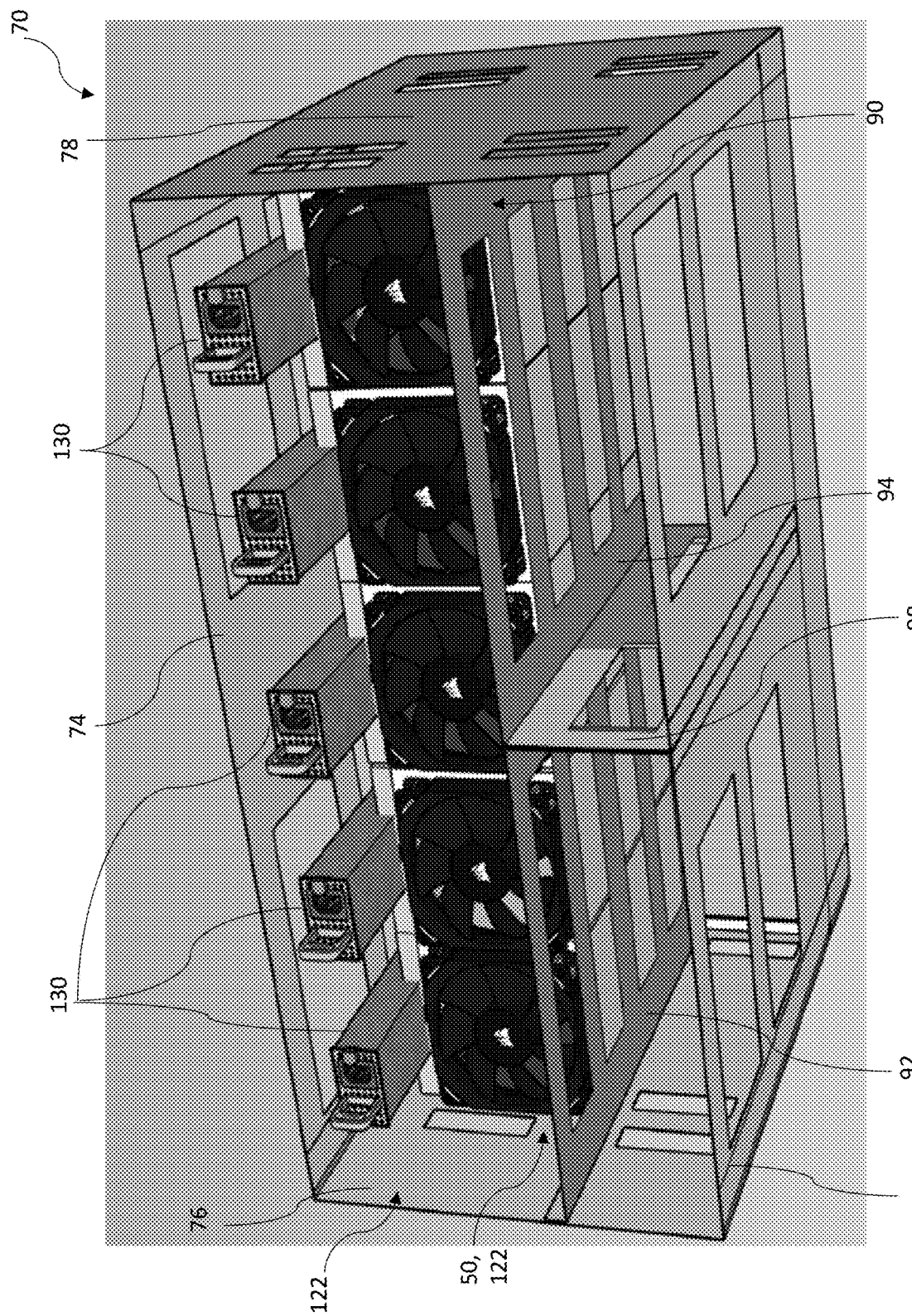
Figure 11:
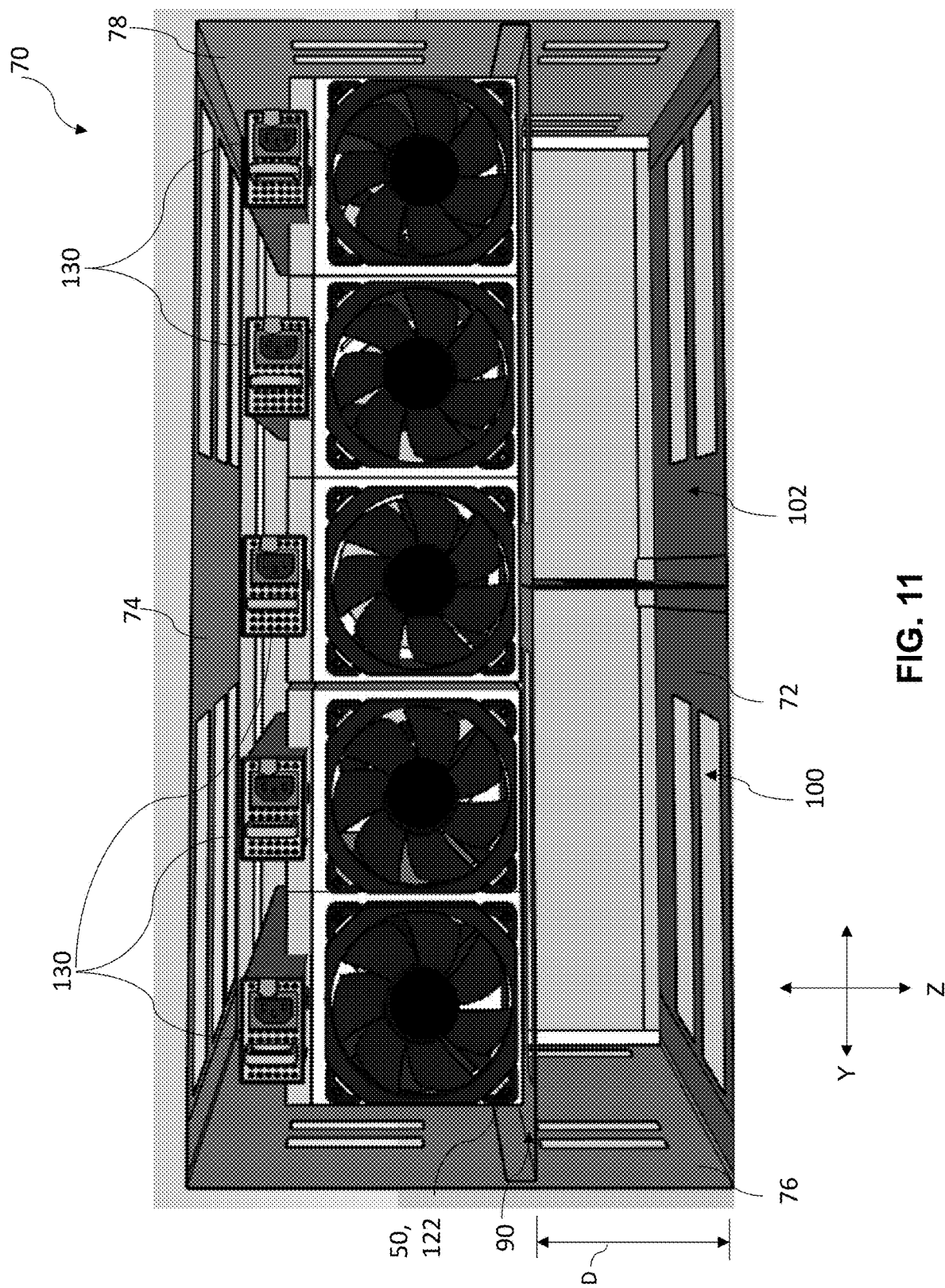
FIG. 11 is a rear view generally illustrating an example of a rack with computing devices according to teachings of the present disclosure.

With examples, such as generally illustrated in FIGS. 9-11, a set of computing devices 22 may be connected with a rack 70. For example and without limitation, a set of five computing devices 22 may be connected to a rack 70. The set of computing devices 22 may be connected to/supported by a shelf 90 of the rack 70 such that the set of computing devices 22 may be disposed substantially between (e.g., vertically/in the Z-direction) the shelf 90 and the second portion 74 and/or between (e.g., laterally/in the Y-direction) the third portion 76 and the fourth portion 78.

Figure 12:
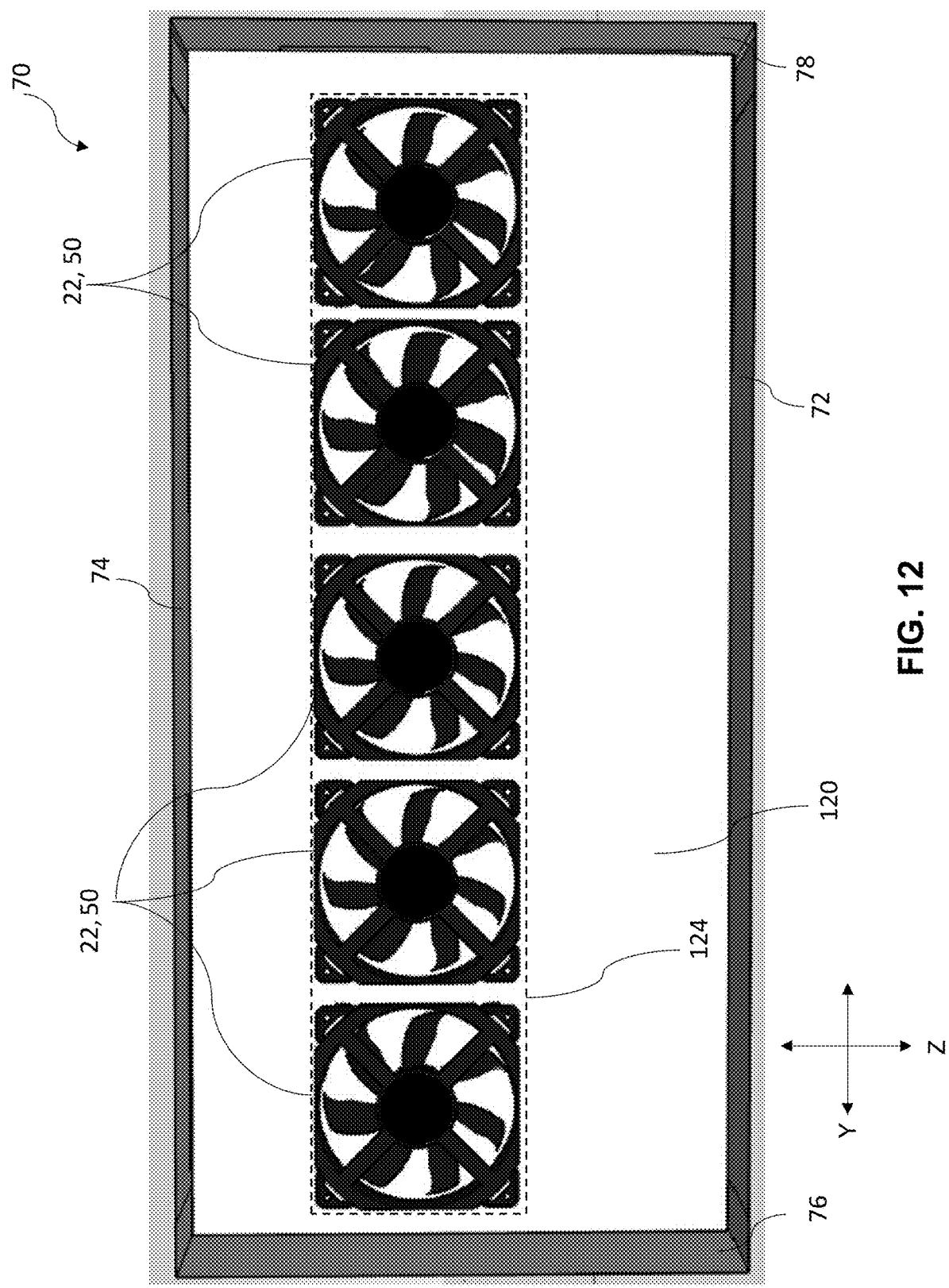
FIG. 12 is a rear view generally illustrating an example of a rack with computing devices and a thermal barrier according to teachings of the present disclosure.
Figure 13:
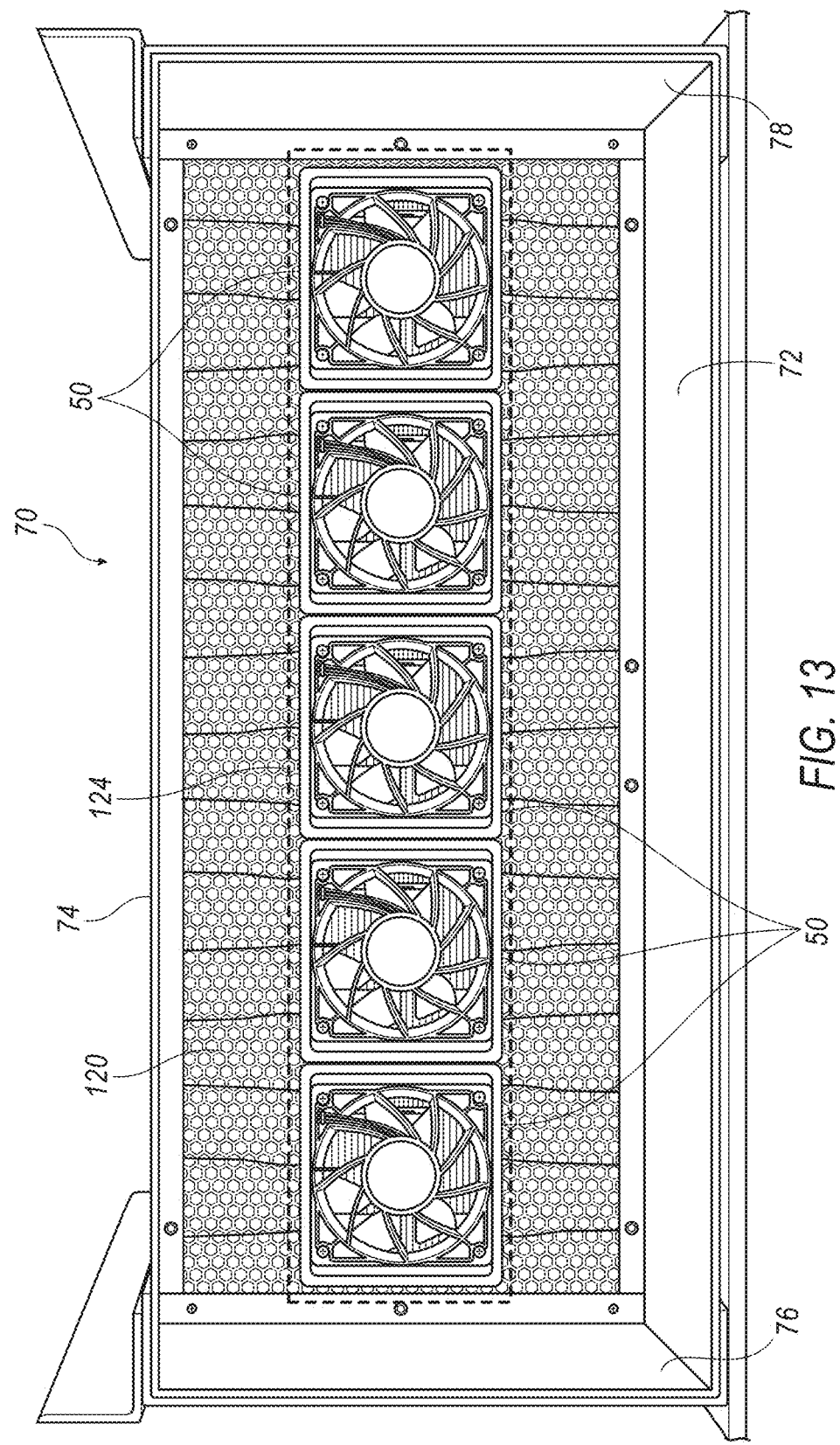
FIG. 13 is a rear view generally illustrating an example of a rack with computing devices and a thermal barrier according to teachings of the present disclosure.
Figure 14:
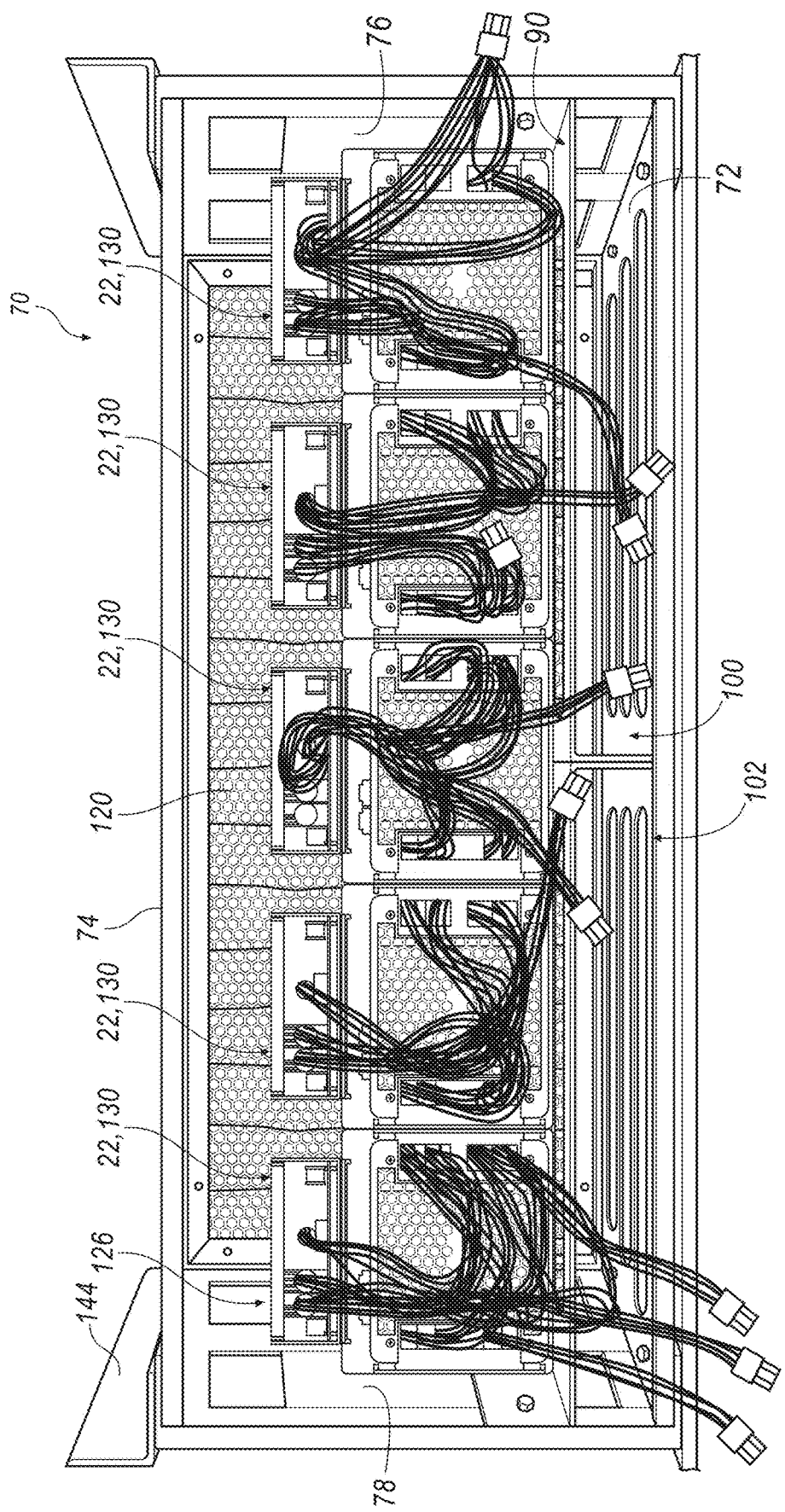
FIG. 14 is a front perspective view generally illustrating an example of a rack with computing devices and a thermal barrier according to teachings of the present disclosure.

In examples, such as generally illustrated in FIGS. 12 and 13, a set of computing devices 22 of a rack 70 may be connected to a thermal barrier 120 of the rack 70. Connecting computing devices 22 to a thermal barrier 120 may include forming an aperture 124 (e.g., exhaust opening) in the thermal barrier 120 for some or all of the computing devices 22. The aperture 124 may, for example and without limitation, correspond to cooling members/air movers 50 of the computing devices 22 such that (i) the air movers 50 may be connected to the thermal barrier 120 at or about the aperture 124, (ii) the air movers 50 may be disposed at least partially in the aperture 124, and/or (iii) the air movers 50 may extend at least partially through the aperture 124. With some examples, the thermal barrier 120 may include a single aperture 124 for all of the computing devices 22 of a set. In other examples, the thermal barrier 120 may include a plurality of apertures/openings 124, such as one for each computing device 22 or for each subset of computing devices 22. The aperture(s) 124 may be configured to facilitate movement of fluid/air from the computing devices 22 (e.g., exhaust), which may be heated by the computing devices 22, from the first chamber 32 to the second chamber 34 (e.g., through an opening 60 of a thermal wall 36). As generally illustrated in FIG. 14, a front end 126 of a rack 70 may be open, such as to facilitate connections (e.g., electrical connections) of the computing devices 22 and/or power supplies 130 that may be connected thereto with other components (e.g., an electronic control unit or ECU 132, a power distribution unit or PDU 134, etc.).

With examples, such as generally illustrated in FIG. 15, a plurality of racks 70, each of which may include a set of computing devices 22, may be connected (e.g., stacked) together to form a sled 140. In examples, a single rack 70 with computing devices 22 may be movable by a pair of operators (e.g., humans). For example and without limitation, a rack 70 may weigh about 50 pounds, about 100 pounds, and/or about 150 pounds (or more or less). As generally illustrated in FIGS. 16 and 17, a rack 70 and/or a sled 140 may be moved via a forklift/lifting device 110 (e.g., via a shelf 90). A sled 140 of racks 70 may, for example and without limitation include about twelve racks 70 and each rack 70 may be sufficiently strong to support the weight of the racks 70 above it. For example and without limitation, the bottom rack 70 may be configured to support at least 1,000 pounds, which may include the connections between the portions 72-78 and/or the connections between the shelf 90 and the portions 72-78 of the bottom rack 70 being configured to support at least 1,000 pounds. Additionally or alternatively, the third portion 76 and the fourth portion 78 (e.g., first and second side panels) may, for example, be configured to support a total weight (e.g., of additional stacked racks) at least ten times a weight of a single rack (e.g., of the first portion 72, the second portion 74, the third portion 76, the fourth portion 78, the shelf 90, the legs 96, 98, and/or the computing devices 22).

With examples, racks 70 of a sled 140 may each include substantially the same width 70W and may or may not include the same or similar heights 70H. The widths 70W of each of the racks 70 may be at least as wide as the opening 60, and/or a combined height of the racks 70 of a sled 140 may be at least as tall as the opening 60.

In examples, a rack 70 may include one or more brackets that may be configured to facilitate connection and/or alignment of a rack 70 with other racks 70. For example and without limitation, a rack 70 may include a first bracket 142 and/or a second bracket 144 that may extend (e.g., perpendicularly) relative to and/or from the second portion 74 of the rack 70 (see, e.g., FIG. 4). The first bracket 142 may be aligned and/or parallel with the third portion 76. The second bracket 144 may be aligned with and/or parallel with the fourth portion 78. A distance between the first bracket 142 and the second bracket 144 of a first rack 70 may correspond to (e.g., be slightly larger than) a distance between the third portion 76 and the fourth portion 78 of a second rack 70' such that the second rack 70' may be received at least partially between the first bracket 142 and the second bracket 144. The first bracket 142 and the second bracket 144 may cooperate to limit relative movement between the first rack 70 and the second rack 70', such as in the Y-direction (e.g., side-to-side movement). The first bracket 142 and the second bracket 144 may be formed separate from or integrally with the rack 70.

Figure 15A:
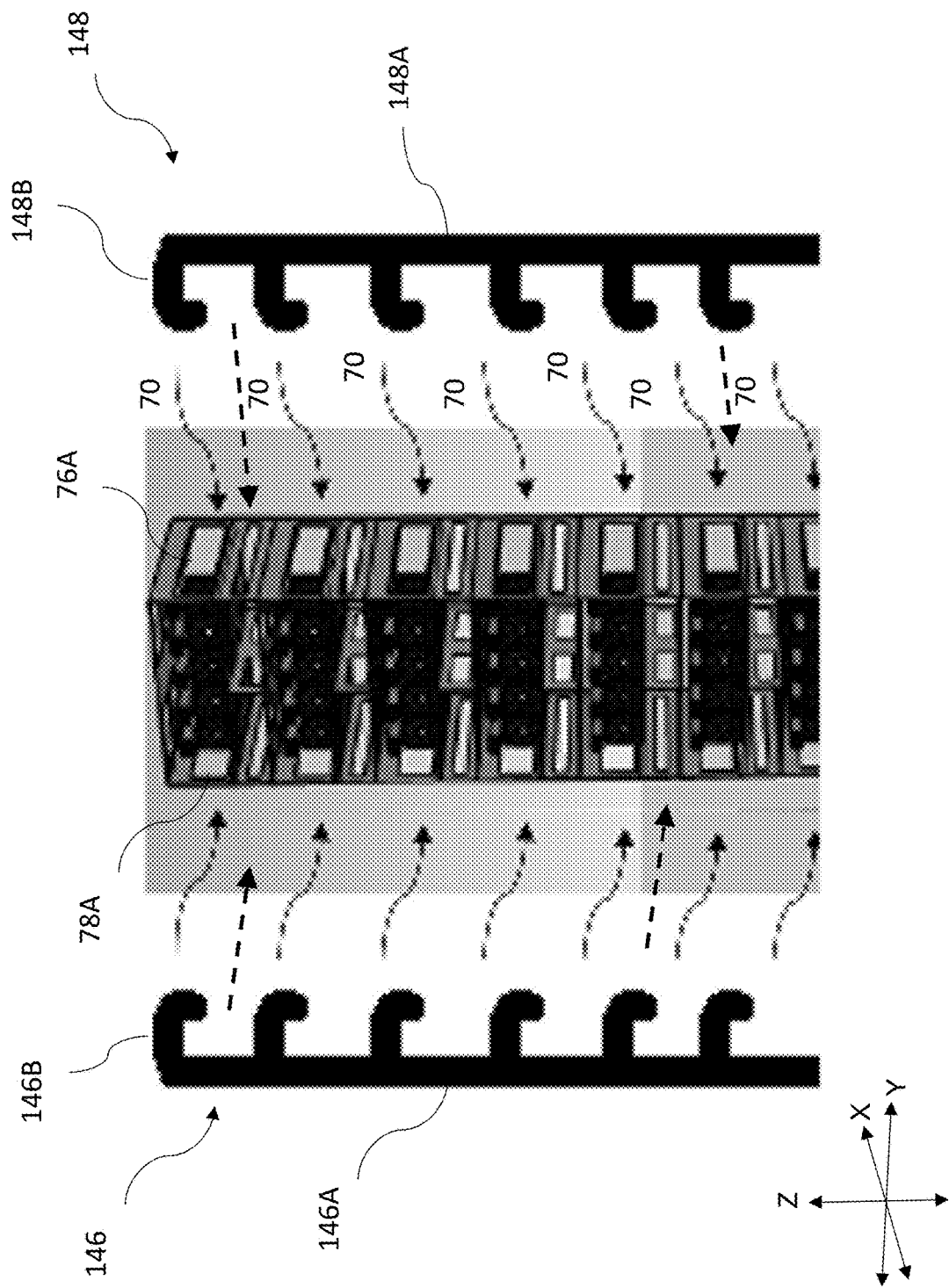
FIG. 15A is a rear perspective view generally illustrating an example of a computing system according to teachings of the present disclosure.

With embodiments, such as generally illustrated in FIG. 15A, a system 20 and/or a sled 140 may include one or more locking members (e.g., locking members 146, 148). A locking member 146, 148 may, for example, be configured to limit movement of one or more racks 70, such as in one or more directions (e.g., X-directions, Y-directions, and/or Z-directions). A first locking member 146 may be configured to engage a rack 70, such as via an aperture 76A of a third portion 76. Additionally or alternatively, a second locking member 148 may be configured to engage a rack 70, such as via an aperture 78A of a fourth portion 78. A locking member 146, 148 may include a rod 146A, 148A that may extend substantially in a Z-direction and/or may include one or more hooks 146B, 148B that may extend substantially perpendicular from the rod 146A, 148A. The hooks 146B, 148B may be configured to engage a rack 70 and/or the apertures 76A, 78A, such as to limit movement of a rack 70. Engagement between a hook 146B, 148B and an aperture 76A, 78B may, for example and without limitation, limit movement of a rack 70 in the Z-direction (e.g., upward movement), X-direction movement (e.g., side-to-side movement), and/or Y-direction movement (e.g., forward/rearward movement). If racks 70 of a system 20 include brackets 142, 144 and locking members 146, 148, the locking members 146, 148 may, for example and without limitation, provide a secondary restriction for X-direction movement (while the brackets 142, 144 provide a primary restriction for X-direction movement) and/or may provide a primary restriction for Y-direction movement and/or Z-direction movement. A locking member 146, 148 may be configured to engage/lock a plurality of racks 70. For example and without limitation, a locking member 146, 148 may include a plurality of hooks 146B, 148B configured to engage respective apertures 76A, 78A of each rack 70 of a sled 140.

Referring again to FIGS. 1 and 2, examples of a rack 70 and/or a sled 140 may be configured for connection with an opening 60 of a thermal wall 36. For example and without limitation, an opening 60 may include dimensions that correspond to (e.g., are slightly smaller than) dimensions of a sled 140 such that a sled 140 may be aligned with the opening 60 and extend beyond the opening 60 (e.g., within the first chamber 32) at least to some degree, such as to limit fluid flow between the thermal wall 36 and the sled 140. Connecting a sled 140 to an opening 60 of a thermal wall 36 may include moving the sled 140, such a via a forklift 110, into alignment with the opening 60 and/or moving the sled 140 up against/adjacent to the thermal wall 36 such that the sled 140 extends beyond the three edges (e.g., left, right, top) of the opening 60. The bottom of the sled 140 may be disposed on the ground/floor 150 and/or the opening 60 may extend down to the ground/floor 150.

With examples, a system 20 may include a seal 160 (e.g., a fluid seal) that may be connected to at least one of the sled 140 and the thermal wall 36. For example and without limitation, the seal 160 may be fixed to the thermal wall 36 about a perimeter of the opening 60 and may be configured to engage (e.g., contact) a sled 140, such as to provide fluid sealing between at least some portions of the thermal wall 36 and the sled 140. The seal 160 may include one or more portions that may or may not be connected to each other. Moving a sled 140 up against/adjacent to a thermal wall 36 may include moving the sled 140 into contact with the seal 160 such that seal 160 deflects or deforms, at least to some degree. The seal 160 may include a resilient material and/or may be biased into contact with the sled 140.

With examples, such as generally illustrated in FIG. 1, a system 20 may include a plurality of sleds (e.g., sleds 140, 140') that may be connected to respective openings (e.g., openings 60, 60') of the same thermal wall (e.g., thermal wall 36) and/or a plurality of walls. A second sled 140' may, for example, be connected to a second opening 60', including a plurality of second racks 70' with second computing devices 22' and second cooling member 50'. A second sled 140' may be connected to a second PDU 134'. The ECU 132 may be connected to and/or configured to control operation of, at least in part, the PDUs 134, 134' and/or the sleds 140, 140'.

In examples, such as generally illustrated in FIG. 1, a sled 140 and/or a thermal wall 36 may include one or more connector assemblies (e.g., connector assemblies 170A, 170B) that may be configured to selectively secure a sled 140 and/or one or more of the racks 70 of a sled 140 with the thermal wall 36. For example and without limitation, the thermal wall 36 may include one or more hinged latches (e.g., latches 172A, 172B) that may be configured to engage a flange or flanges (e.g., flanges 174A, 174B) of the sled 140. A hinged latch 172A, 172B may be configured as a hinged vertical bar that may rotate about an axis aligned with the Z-direction (e.g., a vertical axis) into engagement with the flange(s) 174A, 174B to secure the sled 140 with the thermal wall 36, and may be configured to rotate out of engagement with the flanges 174A, 174B to facilitate disconnection of the sled 140 from the thermal wall 36.

With examples, each rack 70 of a sled 140 may include a thermal barrier 120 (e.g., a thermally insulative panel). The thermal barriers 120 may effectively act/function as extensions of the thermal wall 36 in an opening 60 of the thermal wall 36. A combined surface area of the thermal barriers 120 of a sled 140 may correspond to an area (e.g., width times height) of the opening 60. For example and without limitation, the combined surface area of the thermal barriers 120 of a sled 140 may be at least 50%, at least 60%, at least 70%, at least 80% (or more or less) as large as the area of the opening 60.

Figure 18:
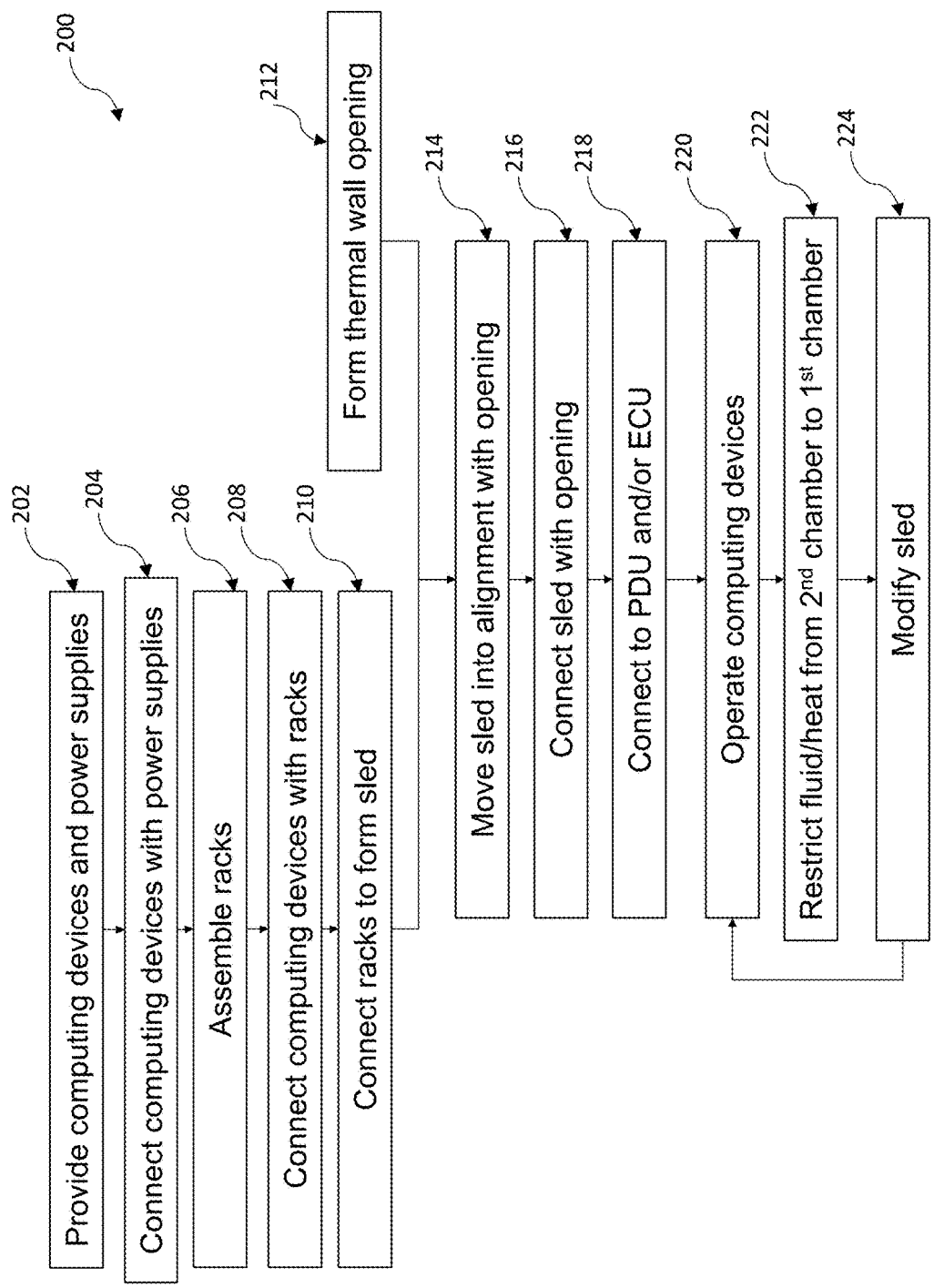
FIG. 18 is a flow diagram generally illustrating an example of a method of operating a computing system according to teachings of the present disclosure.
Figure 19:
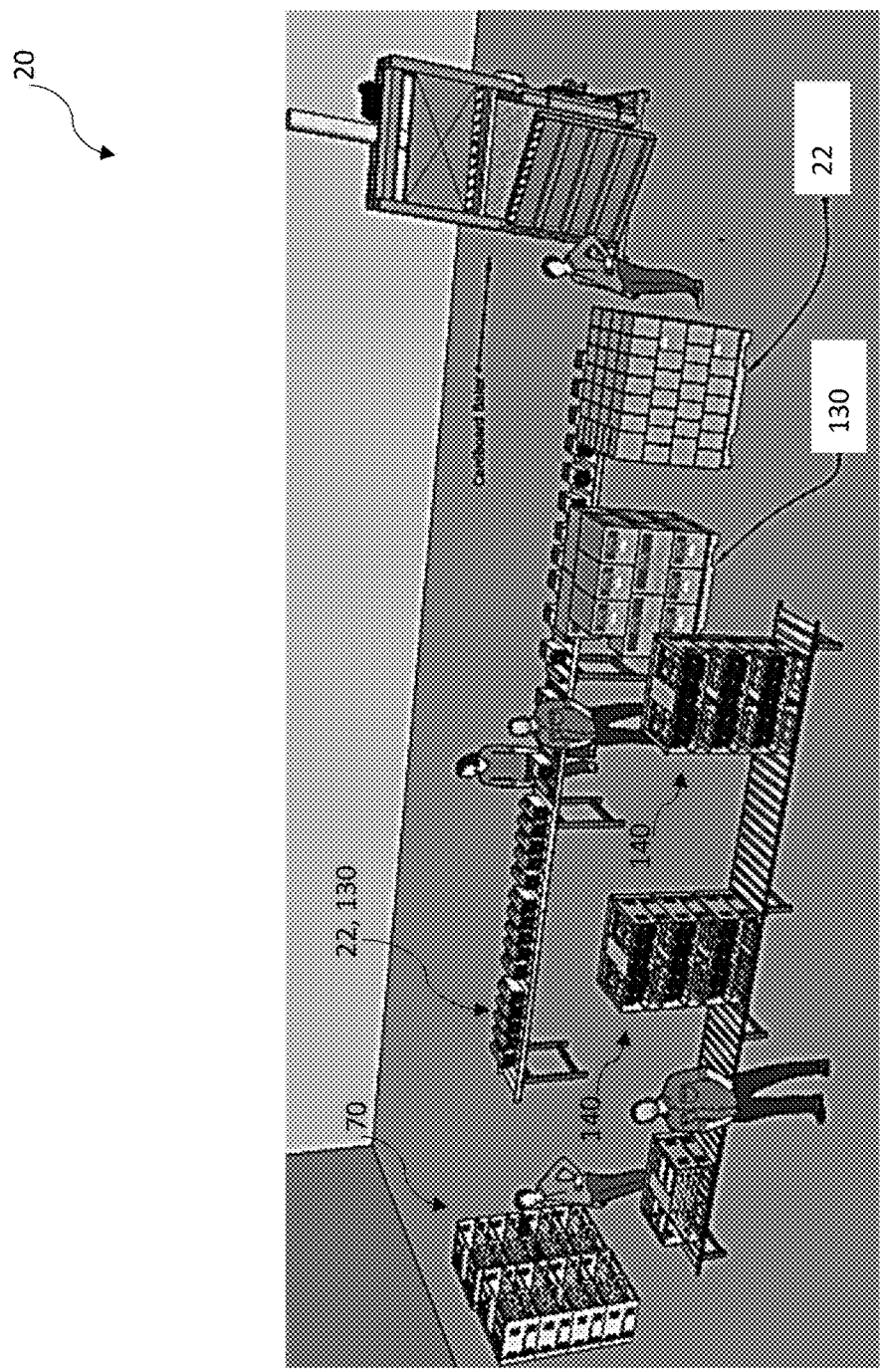
FIG. 19 is a representation of an example facility in which examples of sleds may be assembled according to teachings of the present disclosure.

In examples, such as generally illustrated in FIGS. 18 and 19, a method 200 of operating a system 20 may include providing a plurality of computing devices 22 and a plurality of power supplies 130 (block 202). A respective power supply 130 may be connected to each computing device 22 (block 204). A plurality of racks 70 may be assembled, such as via connecting respective first portions 72, second portions 74, third portions 76, fourth portions 78, shelves 90, and/or thermal barriers 120 (block 206). A set of computing devices 22 with respective power supplies 130 may be connected to each rack 70 (block 208), which may include connecting cooling members/air movers 50 of the computing devices 22 to thermal barriers 120. A plurality of racks 70, such as twelve racks, may be connected together (e.g., stacked on top of each other) to form a sled 140 (block 210). Stacking racks 70 may include a forklift 110 lifting at least some racks 70 on top of a first/bottom rack 70. The method 200 may include forming an opening 60 in a thermal wall 36 between first and second chambers 32, 34 (block 212), such as if an opening 60 is not already present in the thermal wall 36. Forming the sled 140 may be conducted before, during, and/or after forming the opening 60. For example and without limitation, forming the sled 140 may be conducted prior to and/or simultaneously with the formation of the opening 60 and/or the thermal wall 36, such as in a different location and/or a location not immediately proximate the opening 60. The sled 140 may be moved into alignment with the opening 60 (block 214) and connected to thermal wall 36 (block 216), such as via one or more latches 172A, 172B and flanges 174A, 174B. The computing devices 22 may be connected (e.g., electrically) to an ECU 132 and/or PDUs 134 (block 218).

With examples, the method 200 may include operating the computing devices 22 (block 220), such as to perform one or more computing tasks (e.g., cryptocurrency mining, AI computations, etc.). The ECU 132 may control, at least some degree, operation of the computing devices 22. Operating the computing devices 22 may include the air movers 50 of the computing devices 22 moving air (e.g., air heated by the computing devices 22) from the first chamber 32 to the second chamber 34 (e.g., dissipating heat from the computing devices 22). The method 200 may include restricting fluid flow and/or the transfer of heat from the second chamber 34 to the first chamber 32 (block 222), such as via the thermal wall 36, thermal barriers 120 of the racks 70, and/or a seal 160.

In examples, the method 200 may include modifying a sled 140 (block 224), such as by removing a rack 70 and/or a computing device 22 from a rack 70. A first rack 70 may be removed from a sled 140 and replaced with a second rack 70' that may or may not include the same type or configuration of computing devices 22 as the first rack 70. The second rack 70'may include the same or similar dimensions as the first rack 70 and may include a thermal barrier 120, which may facilitate replacing the first rack 70 with the second rack 70' without modifying any other racks 70 of the sled 140 or modifying the thermal wall 36 (or the opening 60 thereof), which may reduce the complexity of such a change and/or reduce downtime for the sled 140 and/or other sleds that may otherwise be taken offline during such a modification. The sled 140 may include substantially the same width and/or height before and after the modification. Once the modification/replacement is complete, the method 200 may return to operating the computing devices 22 (block 220), such as to complete one or more computing tasks.

With examples, modifying a sled 140 may include replacing a computing device or devices 22 of a set of computing devices 22. The computing device(s) 22 may be removed from a rack 70 and replaced with different computing devices 22. The existing thermal barrier 120 may be modified or replaced with a new thermal barrier 120. Similar to replacing a rack 70, such a computing device replacement may not involve modifications of the thermal wall 36.

Compared with methods in which computing devices are separately/uniquely connected with a thermal wall and/or cannot be assembled prior to completion of the thermal wall, examples of systems 20/methods 200 may allow for more efficient assembly, more efficient modification, and/or more efficient operation (e.g., less computing device downtime for initial assembly, less computing device downtime for modification, improved heat dissipation for computing devices 22, reduced power consumption of HVAC systems 38, etc.).

With examples, a sled 140 may include one or more racks 70 that do not include computing devices 22 (e.g., blank or empty racks). Such empty racks may include a thermal barrier 120 and/or may be utilized to fill/cover portions of an opening 60 in a thermal wall 36.

In examples, a computing device and/or an ECU (e.g., computing devices 22, ECU 132) may include an electronic controller and/or include an electronic processor, such as a programmable microprocessor and/or microcontroller. In embodiments, a computing device may include, for example, a central processing unit (CPU), an application specific integrated circuit (ASIC), a graphics processing unit (GPU), and/or a field programmable gate array (FPGA). A computing device may include a memory (e.g., a non-transitory computer-readable storage medium), and/or an input/output (I/O) interface. A computing device may be configured to perform various functions, including those described in greater detail herein, with appropriate programming instructions and/or code embodied in software, hardware, and/or other medium. In embodiments, a computing device may include a plurality of controllers and/or may include a distributed configuration. In embodiments, a computing device may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples,""various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments, ""in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/ embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and"and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. A computing device system, comprising:
a plurality of computing devices; and
a plurality of racks connected together to form a sled;
wherein the plurality of racks are each connected with a respective set of computing devices of the plurality of computing devices;
wherein each rack of the plurality of racks includes a thermal barrier configured to limit fluid and/or heat transfer;
wherein the sled is configured for connection with an opening of a thermal wall that separates a first chamber and a second chamber;
wherein the thermal barriers are configured to function as portions of said thermal wall and at least partially close said opening of said thermal wall to limit fluid and/or heat transfer between said first chamber and said second chamber;
wherein at least one rack of the plurality of racks includes:
a first side panel and a second side panel, each with one or more brackets to restrict side-to-side movement of the rack when stacked to form the sled;
a top panel connected to the first side panel and the second side panel;
a bottom panel connected to the first side panel and the second side panel, wherein the top panel, the bottom panel, the first side panel, and the second side panel form a back opening configured to securely hold the respective thermal barrier;
a shelf panel connected to the first and second side panels and configured to support the respective set of computing devices; and
a support panel connected to the shelf panel and the bottom panel to form two openings configured to receive forklift forks;
wherein the first side panel and the second side panel are configured to support a total weight at least ten times greater than a weight of the respective set of computing devices, the first side panel, the second side panel, the top panel, and the bottom panel.

2. The system of claim 1, wherein the thermal barriers are each configured as a separate thermally insulative panel that is connected to an open end of the respective rack.

3. The system of claim 1, wherein a combined surface area of the thermal barriers corresponds to an area of said opening.

4. The system of claim 1, wherein a first rack of the plurality of racks is connected with a first set of computing devices; and the first set of computing devices includes respective air movers connected to the thermal barrier of the first rack.

5. The system of claim 1, wherein a first set of computing devices includes five computing devices each connected with a respective power supply; a first rack of the plurality of racks is connected to the first set of computing devices; and the first rack is connected to a power distribution unit configured to provide power to the power supplies.

6. The system of claim 1, wherein:
the plurality of racks includes a first rack;
the thermal barrier of the first rack extends above the shelf panel of the first rack and below the shelf panel of the first rack; and
the thermal barrier of the first rack substantially covers a side of the first rack.

7. The system of claim 1, comprising:
a facility, including:
the first chamber;
the second chamber; and
the thermal wall separating and thermally insulating the first chamber and the second chamber;
wherein the thermal barriers are disposed on a side of the sled facing the thermal wall; and
the sled is connected to the opening such that the thermal barriers are aligned with the opening.

8. The system of claim 7, wherein:
the first chamber is configured as a cool aisle;
the second chamber is configured as a hot aisle; and
the sled is disposed in the cool aisle and is connected to the opening of the thermal wall such that fluid communication between the cool aisle and the hot aisle is substantially prevented other than via air movers of the plurality of computing devices.

9. A method of operating computing devices in a facility, the method comprising:
connecting a respective set of computing devices to each of a plurality of racks, each rack of the plurality of racks including a thermal barrier configured to limit fluid and/or heat transfer;
connecting the plurality of racks to form a sled;
connecting the sled to an opening of a thermal wall separating a first chamber from a second chamber; and
at least partially closing the opening with the sled to limit fluid and/or heat transfer between the first chamber and the second chamber;
wherein at least one rack of the plurality of racks includes:
a first side panel and a second side panel, each with one or more brackets to restrict side-to-side movement of the rack when stacked to form the sled;
a top panel connected to the first side panel and the second side panel;
a bottom panel connected to the first side panel and the second side panel, wherein the top panel, the bottom panel, the first side panel, and the second side panel form a back opening configured to securely hold the respective thermal barrier;
a shelf panel connected to the first and second side panels and configured to support the respective set of computing devices; and
a support panel connected to the shelf panel and the bottom panel to form two openings configured to receive forklift forks;
wherein the first side panel and the second side panel are configured to support a total weight at least ten times greater than a weight of the respective set of computing devices, the first side panel, the second side panel, the top panel, and the bottom panel.

10. The method of claim 9, including operating the sets of computing devices;
wherein operating the sets of computing devices includes providing fluid from the first chamber to the second chamber via air movers of the sets of computing devices.

11. The method of claim 10, including:
removing a first rack of the plurality of racks from the sled;
connecting a second rack to the sled to replace the first rack; and
operating the sets of computing devices and second computing devices of the second rack after connecting the second rack without modifying the thermal wall.

12. The method of claim 9, including:
connecting a respective power supply to some or all of the computing devices; and
connecting a respective power distribution to some or all of the plurality of racks.

13. The method of claim 9, including connecting the respective thermal barrier to each rack of the plurality of racks, wherein:
connecting the plurality of racks includes orienting the plurality of racks such that the thermal barriers are disposed on the same side of the sled; and
connecting the sled to the opening of the thermal wall includes aligning the thermal barriers with the opening.

14. The method of claim 9, wherein:
air movers of the computing devices are connected to the thermal barriers;
at least partially closing the opening with the sled includes substantially preventing fluid communication between the first chamber and the second chamber other than via the air movers of the plurality of computing devices; and
moving, via the air movers, fluid from the first chamber through the thermal barriers into the second chamber.

15. The method of claim 9, wherein connecting the sled to the opening of the thermal wall includes moving the sled up against the thermal wall such that the sled extends beyond at least three outer edges of the opening.

16. The method of claim 9, wherein connecting the sled to the opening of the thermal wall includes connecting the sled with a seal and latching the sled to the thermal wall.

17. The method of claim 9, including:
connecting a respective set of second computing devices to each of a plurality of second racks;
connecting the plurality of second racks to form a second sled;
connecting the second sled to a second opening of the thermal wall; and
at least partially closing the second opening with the second sled to limit fluid and/or heat transfer between the first chamber and the second chamber.

18. The method of claim 9, wherein connecting the sled to the opening of the thermal wall includes moving the sled via forks of a forklift inserted into a bottom rack of the plurality of racks.

19. The system of claim 1, including:
a plurality of second computing devices; and
a plurality of second racks connected together to form a second sled;
wherein the plurality of second racks are each connected with a respective set of second computing devices of the plurality of second computing devices;
wherein each second rack of the plurality of second racks includes a second thermal barrier configured to limit fluid and/or heat transfer;
wherein the second sled is configured for connection with a second opening of said thermal wall; and
wherein the second thermal barriers are configured to function as portions of said thermal wall and at least partially close said second opening of said thermal wall to limit fluid and/or heat transfer between said first chamber and said second chamber.

* * * * *